United States Patent
Takeshima

(10) Patent No.: US 11,073,584 B2
(45) Date of Patent: Jul. 27, 2021

(54) MAGNETIC RESONANCE IMAGING APPARATUS

(71) Applicant: Canon Medical Systems Corporation, Otawara (JP)

(72) Inventor: Hidenori Takeshima, Kawasaki (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

(21) Appl. No.: 16/561,615

(22) Filed: Sep. 5, 2019

(65) Prior Publication Data

US 2020/0088824 A1  Mar. 19, 2020

(30) Foreign Application Priority Data

Sep. 6, 2018  (JP) .............................. JP2018-166905
Aug. 28, 2019  (JP) .............................. JP2019-155497

(51) Int. Cl.
  *G01R 33/54*  (2006.01)
  *G01R 33/567*  (2006.01)

(52) U.S. Cl.
  CPC ....... *G01R 33/543* (2013.01); *G01R 33/5673* (2013.01)

(58) Field of Classification Search
  CPC .......................... G01R 33/543; G01R 33/5673
  See application file for complete search history.

(56) References Cited

U.S. PATENT DOCUMENTS

| | | |
|---|---|---|
| 6,292,684 B1 | 9/2001 | Du et al. |
| 10,099,069 B2 | 10/2018 | Partanen et al. |
| 2009/0290770 A1 * | 11/2009 | Mori ................ A61B 5/055 382/128 |
| 2011/0184273 A1 | 7/2011 | Riederer |
| 2016/0131727 A1 | 5/2016 | Sacolick et al. |

FOREIGN PATENT DOCUMENTS

| | | |
|---|---|---|
| JP | 2012-505709 A | 3/2012 |
| JP | 2013-544552 A | 12/2013 |
| JP | 2017-533811 A | 11/2017 |

OTHER PUBLICATIONS

Song, R. et al. "Evaluation of Respiratory Liver and Kidney Movements for MRI Navigator Gating", Journal of Magnetic Resonance Imaging, vol. 33, 2011, pp. 143-148.

* cited by examiner

*Primary Examiner* — G. M. A Hyder
(74) *Attorney, Agent, or Firm* — Oblon, McClelland, Maier & Neustadt, L.L.P.

(57) ABSTRACT

According to one embodiment, a magnetic resonance imaging apparatus includes imaging control circuitry and processing circuitry. The imaging control circuitry acquires MR signals in accordance with a first pulse sequence set in an imaging protocol. The processing circuitry determines, during MR signal acquisition according to the first pulse sequence, whether or not additional acquisition of MR signals is necessary based on a determination of image quality based on the acquired MR signals, and if necessity of additional acquisition is determined, adds a second pulse sequence for the additional acquisition to the imaging protocol. The imaging control circuitry acquires MR signals in accordance with the added second pulse sequence. The processing circuitry reconstructs an MR image based on the MR signals acquired through the first pulse sequence and the second pulse sequence.

19 Claims, 13 Drawing Sheets

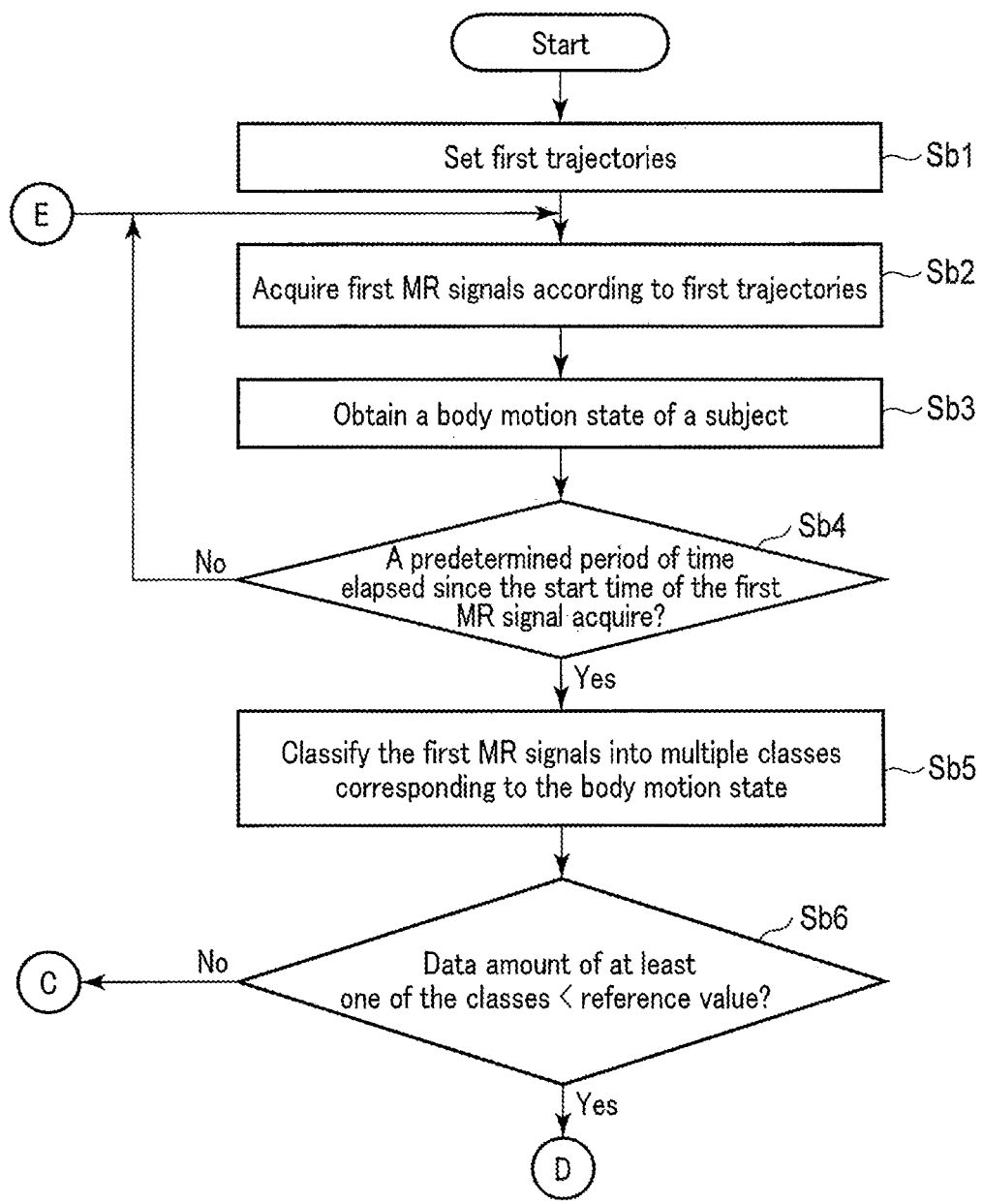
F I G. 8

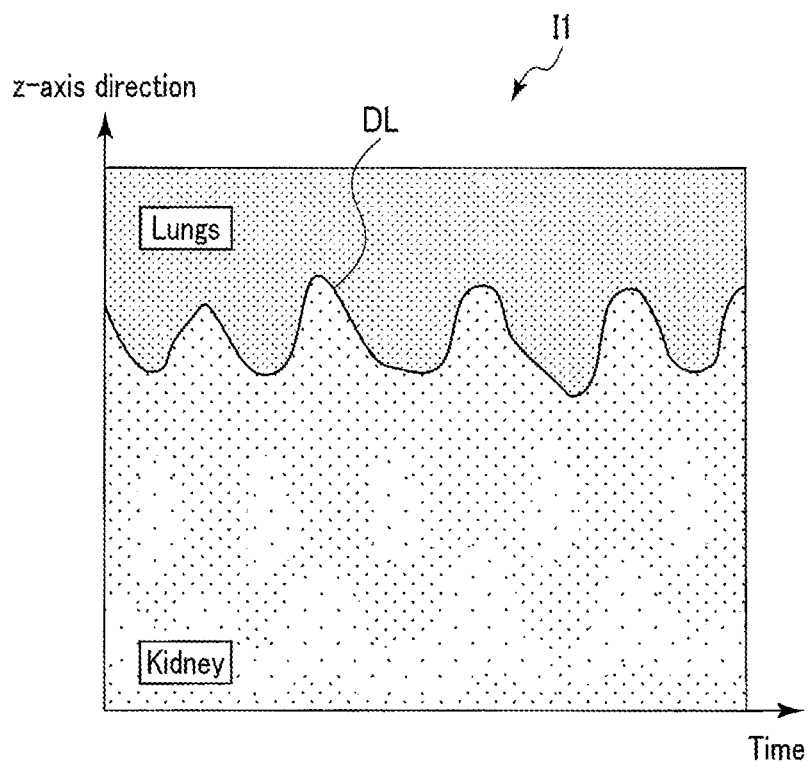
F I G. 11
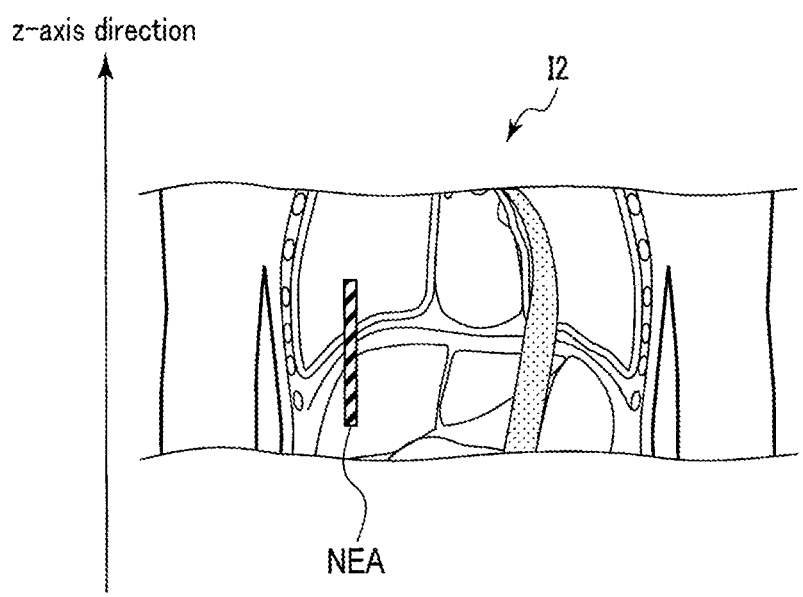
F I G. 12

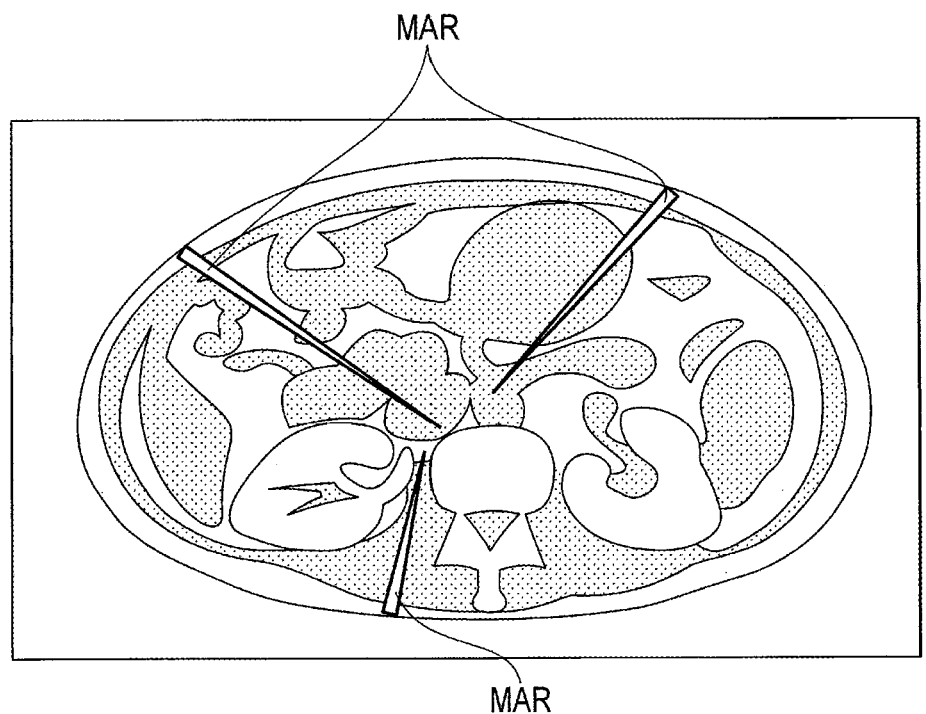
F I G. 13
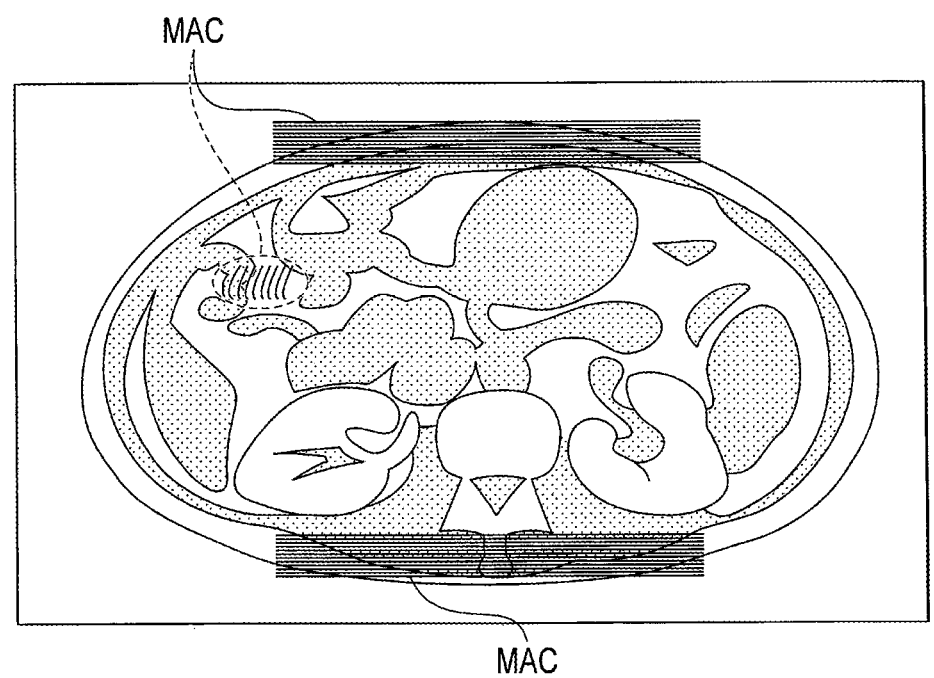
F I G. 14

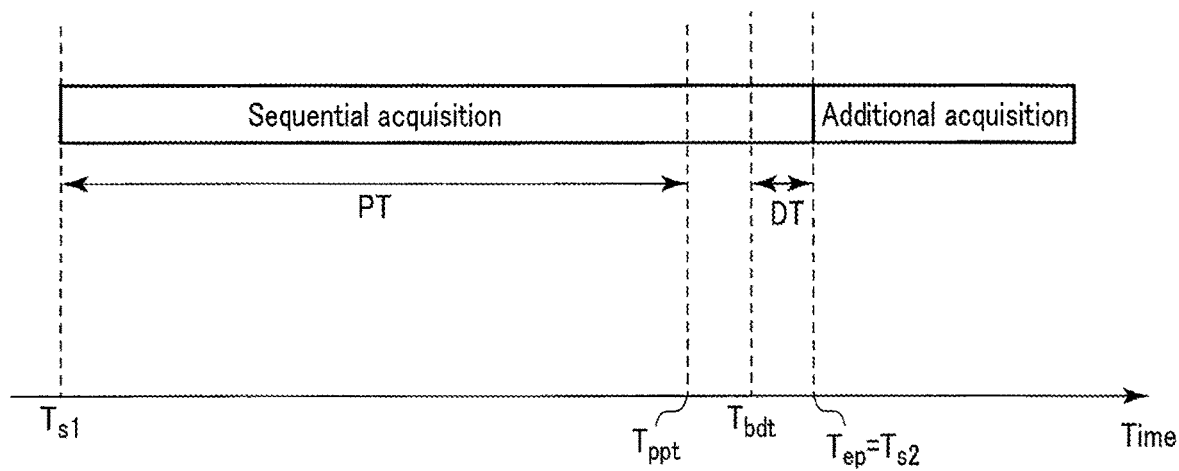
F I G. 15
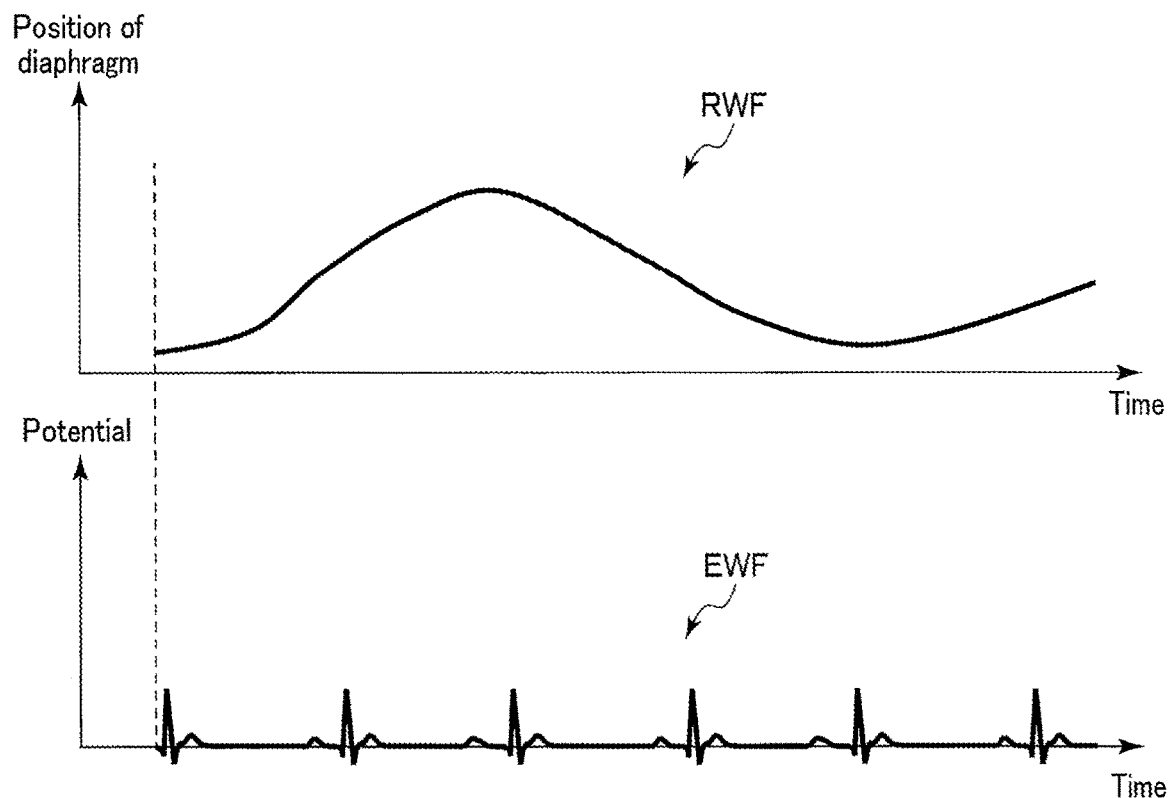
F I G. 16

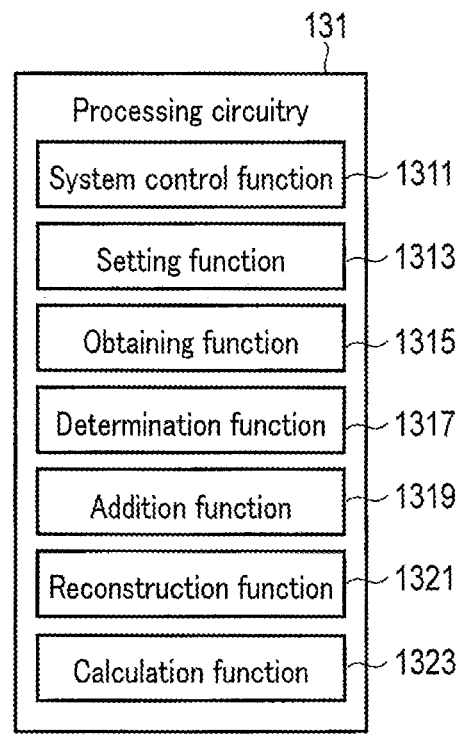
F I G. 17
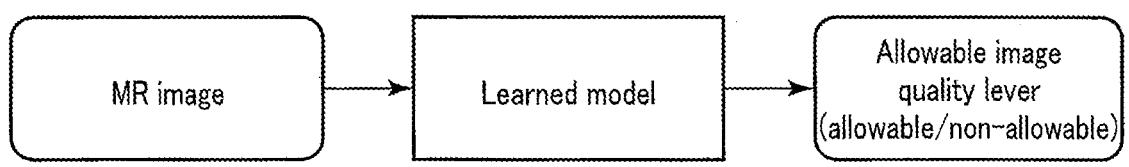
F I G. 18

MAGNETIC RESONANCE IMAGING APPARATUS

CROSS-REFERENCE TO RELATED APPLICATIONS

This application is based upon and claims the benefit of priority from the Japanese Patent Application No. 2018-166905, filed Sep. 6, 2018, and the Japanese Patent Application No. 2019-155497, filed Aug. 28, 2019, the entire contents of all of which are incorporated herein by reference.

FIELD

Embodiments described herein generally relate to a magnetic resonance imaging apparatus.

BACKGROUND

There is a case where a down sampling technique is used to acquire magnetic resonance (MR) signals in magnetic resonance imaging. In such a case, navigator data and MR signals are acquired, and the navigator data is used for MR signal recollection and motion correction to the MR signals.

In such a method of acquiring MR signal, a data amount of MR signals necessary to reconstruct an MR image is not considered. For this reason, usually extra MR signals are acquired in order to compensate for deterioration of image quality due to an insufficient amount of data required for reconstruction. In a case where a motion state of a subject changes when MR signals are acquired, since a data amount necessary for reconstruction cannot be known in advance of reconstruction, image quality of a reconstructed MR image cannot be guaranteed.

BRIEF DESCRIPTION OF THE DRAWINGS

FIG. 8 is a flow chart showing an example of a procedure of an additional acquisition execution process according to the first modification.

FIG. 11 is a diagram showing an example of a projection image generated in a third modification.

FIG. 12 is a diagram showing an example of a region to which a navigation echo method is applied, which is indicated in a locator image and used in the third modification.

FIG. 13 is a diagram showing an example of body motion artifact drawn on a partial image in a case where a scanning scheme takes the form of radial scanning in a fifth modification.

FIG. 14 is a diagram showing an example of body motion artifact drawn on a partial image in a case where a scanning scheme takes the form of Cartesian scanning in the fifth modification.

FIG. 15 is a diagram showing an example of an acquisition start time, a predetermined period of time, a finish time of the predetermined period of time, a determination start limit time, an additional determination time, and a start time of additional acquisition, regarding an additional acquisition execution process in a sixth modification.

FIG. 16 is a diagram showing an example of a respiratory wave form and an electrocardiogram waveform in an eighth modification.

FIG. 17 is a diagram showing an example of a configuration of processing circuitry according to an application example.

FIG. 18 is a diagram schematically showing an example of an input and output of a learned model according to another example of the embodiment.

DETAILED DESCRIPTION

In general, according to one embodiment, a magnetic resonance imaging apparatus includes imaging control circuitry and processing circuitry. The imaging control circuitry acquires MR signals in accordance with a first pulse sequence set in an imaging protocol. The processing circuitry determines, during MR signal acquisition according to the first pulse sequence, whether or not additional acquisition of MR signals is necessary based on a determination of image quality based on the acquired MR signals, and if necessity of additional acquisition is determined, adds a second pulse sequence for the additional acquisition to the imaging protocol. The imaging control circuitry acquires MR signals in accordance with the added second pulse sequence. The processing circuitry reconstructs an MR image based on the MR signals acquired through the first pulse sequence and the second pulse sequence.

Hereinafter, an embodiment of the magnetic resonance imaging (MRI) apparatus will be described in detail with reference to the drawings. In the description hereinafter, structural elements having substantially the same functions and configurations will be denoted by the same reference symbols, and a repetitive description of such elements will be given only where necessary.

Figure 1:
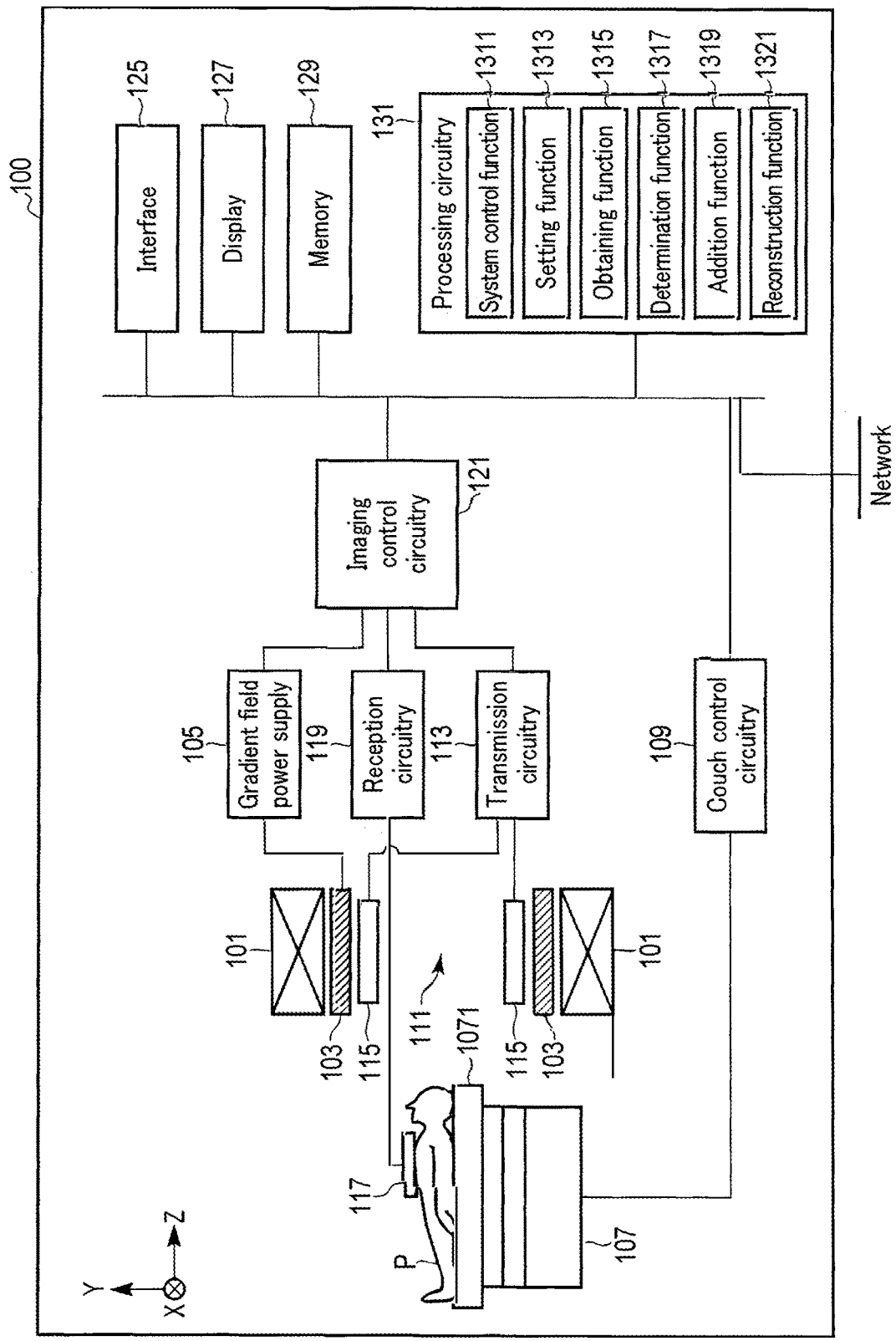
FIG. 1 is a diagram showing an example of a configuration of a magnetic resonance imaging apparatus in an embodiment.

FIG. 1 is a diagram showing the configuration of the MRI apparatus 100 according to the present embodiment. As shown in FIG. 1, the MRI apparatus 100 includes a static field magnet 101, a gradient coil 103, a gradient field power supply 105, a couch 107, couch control circuitry 109, transmission circuitry (transmitter) 113, a transmitter coil 115, a receiver coil 117, reception circuitry (receiver) 119, imaging control circuitry (imaging controller) 121, an interface (input section) 125, a display 127, a memory (storage) 129, and processing circuitry (processor) 131. The MRI apparatus 100 may have a hollow cylindrical-shaped shim coil provided between the static field magnet 101 and the gradient coil 103.

The static field magnet 101 is a magnet formed in a hollow, approximately cylindrical shape. The static field magnet 101 is not necessarily in an approximately cylindrical shape; it may be formed in an open shape. The static field magnet 101 generates a uniform static magnetic field in the inner space. For example, a superconducting magnet or the like is used as the static field magnet 101.

The gradient coil 103 is a hollow cylindrical coil. The gradient coil 103 is provided inside the static field magnet 101. The gradient coil 103 is a combination of three coils corresponding to X-, Y-, Z-axes orthogonal to one another. The Z-axis direction is the same direction as the direction of the static magnetic field. In addition, the Y-axis direction is a vertical direction, and the X-axis direction is a direction perpendicular to each of the Z-axis and the Y-axis. The three coils in the gradient coil 103 individually receive a current from the gradient field power supply 105 and respectively generate gradient magnetic fields in which magnetic field intensity changes along each of the X-, Y-, and Z-axes.

The gradient fields along each of the X-, Y-, and Z-axes generated by the gradient coil 103 respectively correspond to, for example, a slice selective gradient field, a phase encode gradient field, and a frequency encode gradient field (readout gradient field). The slice selective gradient field is used to discretionarily determine an imaging slice. The phase encode gradient field is used to change the phase of MR signals in accordance with spatial positions. The frequency encode gradient field is used to change the frequency of MR signals in accordance with spatial positions.

The gradient field power supply 105 is a power supply device that supplies a current to the gradient coil 103 under the control of the imaging control circuitry 121.

The couch 107 is an apparatus including a couch top 1071 on which a subject P is placed. The couch 107 inserts the couch top 1071 on which the subject P is placed into the bore 111 under the control of the couch control circuitry 109. The couch 107 is installed in an examination room, where the MRI apparatus 100 is installed, in such a manner that the longitudinal axis of the couch 107 is parallel to the central axis of the static field magnet 101.

The couch control circuitry 109 is circuitry that controls the couch 107. The couch control circuitry 109 drives the couch 107 in accordance with an operator's instruction via the interface 125 to move the couch top 1071 in a longitudinal direction and a vertical direction.

The transmission circuitry 113 supplies a high-frequency (radio frequency (RF)) pulse modulated by a Larmor frequency to the transmitter coil 115 by the control of the imaging control circuitry 121.

The transmitter coil 115 is an RF coil provided inside the gradient coil 103. The transmitter coil 115 is supplied with the RF pulse from the transmission circuitry 113 and generates a transmit RF wave corresponding to a radio frequency magnetic field. The transmitter coil 115 is, for example, a whole-body coil (WB coil) including a plurality of coil elements. The WB coil may be used as a transmitter/receiver coil. The transmitter coil 115 may also be a WB coil made of a single coil.

The receiver coil 117 is an RF coil provided inside the gradient coil 103, in the bore 111. The receiver coil 117 receives MR signals that are emitted from the subject P, caused by a radio frequency magnetic field. The receiver coil 117 outputs the received MR signals to the reception circuitry 119. The receiver coil 117 is a coil array including, for example, one or more, typically, a plurality of coil elements. In FIG. 1, the transmitter coil 115 and the receiver coil 117 are illustrated as separate RF coils; however, the transmitter coil 115 and the receiver coil 117 may be realized by an integrated transmitter/receiver coil. The transmitter/receiver coil is, for example, a local transmitter/receiver RF coil, such as a head coil, to serve as an imaging target in the subject P.

The reception circuitry 119 generates a digital MR signal (hereinafter referred to as "MR data") based on the MR signal output from the receiver coil 117 under the control of the imaging control circuitry 121. Specifically, the reception circuitry 119 performs various types of signal processing to the MR signal output from the receiver coil 117, and then performs analog-to-digital (A/D) conversion and sampling to data to which the variety of signal processing is performed. MR data is thus generated. The reception circuitry 119 outputs the generated MR data to the imaging control circuitry 121.

The imaging control circuitry 121 controls, for example, the gradient field power supply 105, the transmission circuitry 113, and the reception circuitry 119 in accordance with an imaging protocol output from the processing circuitry 131 to perform MR imaging on the subject P.

In the present embodiment, the imaging control circuitry 121 acquired MR signals in accordance with a first pulse sequence set in an imaging protocol. The first pulse sequence is a pulse sequence initially set by the setting function 1313 of the processing circuitry 131. The imaging control circuitry 121 acquires MR signals in accordance with a second pulse sequence set in an imaging protocol. The second pulse sequence is a pulse sequence added by the addition function 1319 of the processing circuitry 131.

The pulse sequences in the present embodiment are sequences of various types of RF pulses, and parameters of the pulse sequences include any parameters defining the RF pulses. The pulse sequences define, for example, the magnitude of the current supplied from the gradient field power supply 105 to the gradient coil 103, timing of the supply of the current from the gradient field power supply 105 to the gradient coil 103, the magnitude and time width of the RF pulse supplied from the transmission circuitry 113 to the transmitter coil 115, timing of the supply of the RF pulse from the transmission circuitry 113 to the transmitter coil 115, and timing of reception of the MR signal at the receiver coil 117, etc. The parameters of the pulse sequences include a trajectory indicating an MR signal-acquired position on k-space (k-space filling trajectory), a flip angle, a transmission frequency of various RF pulses, and an echo order indicating the order of trajectories. Any types of trajectories corresponding to various scanning schemes, such as stack-of-stars, Cartesian, radial, PROPELLER (periodically rotated overlapping parallel lines with enhanced reconstruction), spiral, etc., can be used.

Specifically, the imaging control circuitry 121 sequentially acquires MR signals relating to the subject P (referred to as "first MR signals") in accordance with first trajectories set courtesy of the setting function 1313 of the processing circuitry 131. The first trajectories correspond to acquisition trajectories of a plurality of first MR signal-acquired positions (hereinafter referred to as "first acquisition positions") in k-space, in other words, filling trajectories of the first MR signals in k-space. For example, the first trajectories are set courtesy of the setting function 1313 in advance of the performance of MR imaging, through an operator's instruction via the interface 125.

The interface 125 includes a circuit that receives various instructions and information inputs from the operator. The interface 125 includes a circuit relating to, for example, a pointing device such as a mouse, or an input device such as a keyboard. The circuit included in the interface 125 is not limited to a circuit relating to a physical operational component, such as a mouse or a keyboard. For example, the interface 125 may include an electrical signal processing circuit which receives an electrical signal corresponding to an input operation from an external input device provided separately from the present MRI apparatus 100 and outputs the received electrical signal to various circuits. The interface 125 may obtain various types of data from various types of living body signal-measuring devices, an optical camera, an external memory device, or various types of modality, which are coupled either via a network, etc. or directly to the interface 125, under the control of the processing circuitry 131.

The display 127 displays, for example, MR images generated courtesy of the reconstruction function 1321, and various types of information relating to MR imaging and image processing, under the control of the system control function 1311 in the processing circuitry 131. The display 127 is, for example, a CRT (cathode-ray tube) display, a liquid crystal display, an organic EL (electro luminescence) display, an LED (light-emitting diode) display, a plasma display, or any other display or a monitor known in this technical field.

The memory 129 stores MR data filled in k-space by a reconstruction function 1321, and MR image data generated by the reconstruction function 1321, etc. The memory 129 stores various types of imaging protocols, imaging conditions including a plurality of imaging parameters defining the imaging protocols, and trajectories corresponding to a scanning scheme performed on the subject P, and the like. The memory 129 stores programs relating to various reconstruction methods used in the reconstruction function 1321. Reconstruction methods are, for example, parallel imaging, compression sensing, and a learned neural network.

The memory 129 stores programs corresponding to various functions executed by the processing circuitry 131. The memory 129 is, for example, a semiconductor memory element, such as a RAM (Random Access Memory) and a flash memory, a hard disk drive, a solid state drive, or an optical disk, etc. The memory 129 may also be, for example, a drive that performs reading and writing various kinds of information on a portable storage medium such as a CD-ROM drive, a DVD drive, or a flash memory.

The processing circuitry 131 includes, as hardware resources, a processor and a memory such as a read-only memory (ROM) and a RAM, which are not shown, and generally controls the present MRI apparatus 100. The processing circuitry 131 includes the system control function 1311, the setting function 1313, the obtaining function 1315, the determination function 1317, the addition function 1319, and the reconstruction function 1321. The various functions, which are performed through the system control function 1311, the setting function 1313, the obtaining function 1315, the determination function 1317, the addition function 1319, and the reconstruction function 1321, are stored in the memory 129 in a form of a computer-executable program. The processing circuitry 131 is a processor which reads a program corresponding to each function from the memory 129 and executes the program to realize the function corresponding to the program. In other words, the processing circuitry 131 that has read each program has the functions shown in the processing circuitry 131 of FIG. 1, etc.

FIG. 1 illustrates the case where the various functions are realized in a single processing circuit 131; however, the processing circuitry 131 may be constituted by a combination of a plurality of independent processors, and the functions may be realized by the processors executing the programs. In other words, each of the above-mentioned functions may be configured as a program, and single processing circuitry executes each program, or a specific function may be implemented in exclusive, independent program—execution circuitry. The system control function 1311, the setting function 1313, the obtaining function 1315, the determination function 1317, the addition function 1319, and the reconstruction function 1321 of the processing circuitry 131 are examples of a system controlling unit, a setting unit, an acquisition unit, a determination unit, an addition unit, and a reconstruction unit.

The term "processor" used in the above explanation means, for example, circuitry such as a CPU (central processing unit), a GPU (graphics processing unit), an ASIC (application specific integrated circuit), or a programmable logic device (for example, an SPLD (simple programmable logic device), a CPLD (complex programmable logic device), or an FPGA (field programmable gate array)).

The processor reads and executes a program stored in the memory 129 to activate the corresponding function. A program may be directly integrated into the circuitry of the processor, instead of storing the program on the memory 129. In this case, the processor reads and executes a program integrated into the circuitry to realize the corresponding function. Similarly, each of the couch control circuitry 109, the transmission circuitry 113, the reception circuitry 119, and the imaging control circuitry 121, etc. are constituted by an electronic circuit, such as the above-described processor.

The processing circuitry 131 generally controls the MRI apparatus 100 by the system control function 1311. Specifically, the processing circuitry 131 reads a system control program stored in the memory 129 and expands it in the memory, and controls each circuitry of the MRI apparatus 100 in accordance with the expanded system control program. For example, the processing circuitry 131 reads an imaging protocol from the memory 129 by the system control function 1311 based on an imaging condition input by the operator via the interface 125. The processing circuitry 131 may generate the imaging protocol based on the imaging condition. The processing circuitry 131 transmits the imaging protocol to the imaging control circuitry 121, and controls imaging on the subject P.

The processing circuitry 131 fills MR data along a readout direction of k-space in accordance with, for example, an intensity of the readout gradient magnetic field via the reconstruction function 1321. The processing circuitry 131 generates an MR image by executing a Fourier transform to the MR data filled in k-space. The generation of an MR image is not limited to the above-described method, and may be performed by a method of reconstructing an MR image through normalization with the use of MR data including deficiency data, such as parallel imaging and compressing sensing, or may be performed with the use of a deep neural network learned through MR data including deficiency data. The processing circuitry 131 outputs the MR image to the display 127 and the memory 129.

The above is the description of the general configuration of the MRI apparatus 100 according to the present embodiment. In the following, the additional acquisition execution process of the present embodiment will be described. The additional acquisition is additional imaging performed to the subject P courtesy of the determination function 1317 of the processing circuitry 131. The additional acquisition execution process is a process of executing additional acquisition when the necessity of additional acquisition is determined based on a data amount of the first MR signals and a body motion state of the subject P.

The memory 129 stores a threshold for classifying the body motion state of the subject P into multiple classes. For example, if the body motion originates from a respiratory movement of the subject P, the multiple classes are, for example, two classes, an expiration phase and an inspiration phase. At this time, the threshold is a position of the diaphragm, for example. The multiple classes are not limited to the above two classes; they may consist of three or more classes including at least one intermediate state between the expiration phase and the inspiration phase, or may be continuous, stepless classes in accordance with the continuous change of the body motion state. At this time, the memory 129 either stores two or more thresholds according to the aforementioned three or more classes, or stores continuous thresholds according to such stepless classes.

To make the description concrete, hereinafter suppose the body motion of the subject P originates from respiration. In addition, suppose the body motion state consists of two classes, an inspiration phase and an expiration phase. The body motion state is not limited to an approximately-cyclic body motion, such as the above-described respiration, and may be any type of body motion state, as long as it originates from a body motion of the subject P, such as pulsation or phonation of the subject P.

The memory 129 stores a predetermined period of time between a time when the first MR signal acquisition is started and a time when the determination of whether or not additional acquisition is necessary is begins. For example, the predetermined period of time is a certain period of time for acquiring a necessary data amount for determining whether or not additional acquisition is necessary. The predetermined period of time may be appropriately input or changed by an operator's instruction via the interface 125. The predetermined period of time may be zero. The memory 129 stores a reference value used for determining whether or not additional acquisition is necessary in accordance with a data amount of first MR signals belonging to each of the multiple classes. The reference value may be preset so as to guarantee image quality of an MR image reconstructed courtesy of the reconstruction function 1321, for example.

Figure 2:
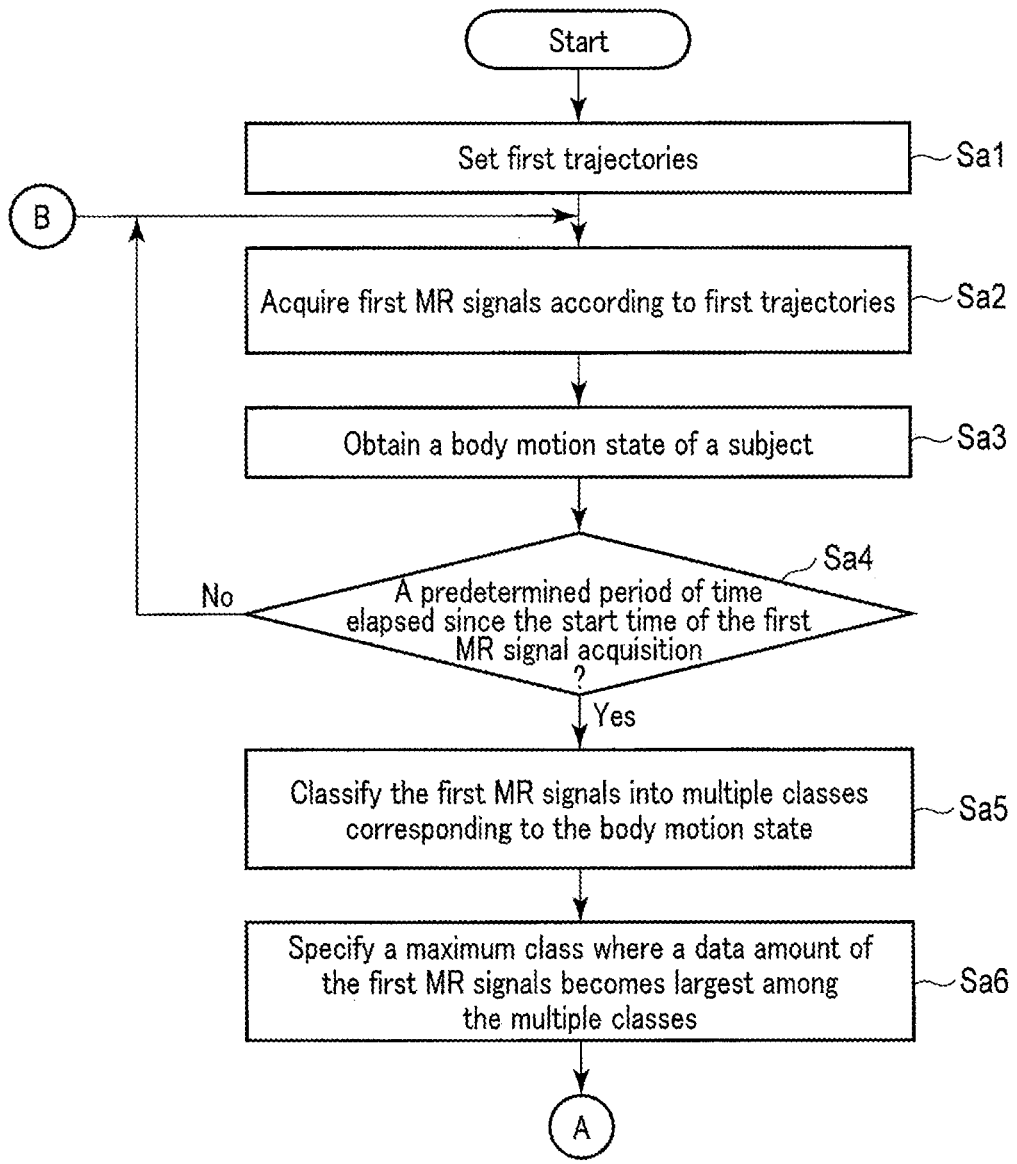
FIG. 2 is a flow chart showing an example of a procedure of an additional acquisition execution process according to the embodiment.
Figure 3:
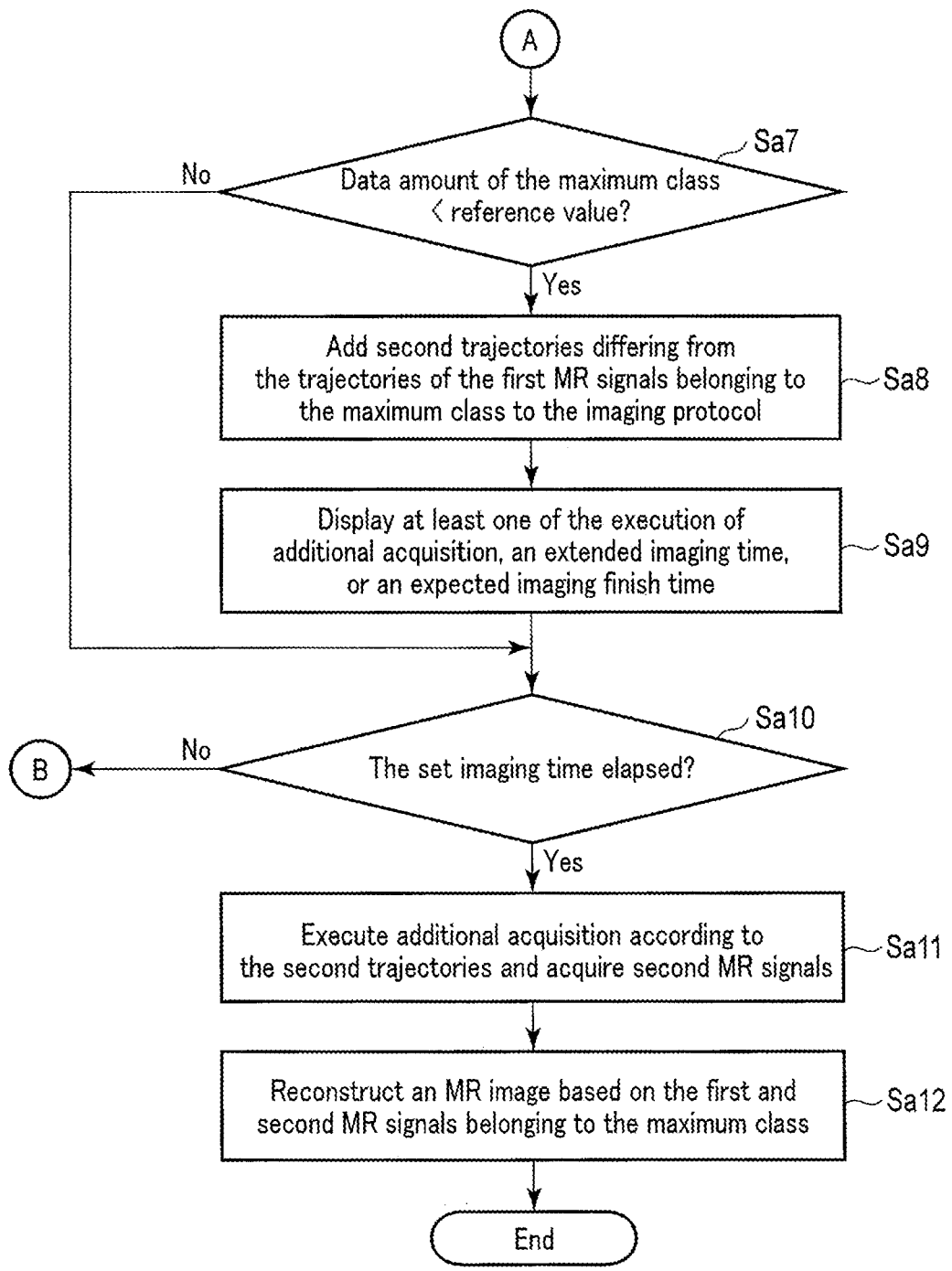
FIG. 3 is a flow chart showing an example of a procedure of an additional acquisition execution process according to the embodiment.

FIGS. 2 and 3 are flow charts showing an example of a procedure of the additional acquisition execution process.

In the description hereinafter, suppose trajectories of identical acquisition positions or unidentical acquisition positions are mainly set and added as a pulse sequence through the setting function 1313 and the addition function 1319.

(Step Sa1)

The processing circuitry 131 sets, through the setting function 1313, first trajectories indicating first acquisition positions of the first MR signals in k-space, in accordance with an operator's instruction via the interface 125. To make the description concrete, hereinafter suppose the processing circuitry 131 sets, as first trajectories, filling trajectories of the first MR signals in k-space obtained through radial scanning. The interface 125 inputs imaging conditions for the subject P in accordance with an operator's instruction.

(Step Sa2)

The imaging control circuitry 121 acquires the first MR signals in accordance with the set first trajectories. In more details, the imaging control circuitry 121 performs MR imaging on the subject P in accordance with the first pulse sequence that includes the first trajectories, and acquires the first MR signals relating to the subject P. For example, the imaging control circuitry 121 acquires the first MR signals by performing the MR imaging to the subject P under free respiration, in other words, in an asynchronous manner. The imaging control circuitry 121 outputs the acquired first MR signals to the memory 129 along with acquisition times. The memory 129 stores the first MR signals along with associated acquisition times.

(Step Sa3)

The processing circuitry 131 obtains a body motion state of the subject P during the acquisition of the first MR signals courtesy of the obtaining function 1315. Specifically, the processing circuitry 131 obtains data output from a respiration belt attached to the subject P via the interface 125 as a body motion state. The data output from the respiration belt corresponds to a respiration level of the subject P, in other words, the position of the diaphragm of the subject P. The processing circuitry 131 outputs, to the memory 129, the position of the diaphragm as a body motion state, along with a detection time when the position of the diaphragm is detected. The memory 129 stores the position of the diaphragm along with the detection time. The processing circuitry 131 may store the position of the diaphragm along with the detection time in a memory of the circuitry itself.

The processing circuitry 131 may obtain, as a body motion state, data output from an optical camera that optically takes an image of the subject P, instead of a respiration level. In this case, the optical camera is a camera that takes an image of either the whole body or part of the body of the subject P (for example, eye, hand, face, or abdomen). To make the description concrete, hereinafter suppose the processing circuitry 131 obtains the position of the diaphragm from the respiration belt.

(Step Sa4)

The processing circuitry 131 determines, through the determination function 1317, whether or not the predetermined period of time has elapsed since the first MR signal acquisition start time. If the predetermined period of time has not elapsed since the acquisition start time (No in step Sa4), the imaging control circuitry 121 repeatedly acquires the first MR signals in accordance with the first trajectories and the imaging conditions. When the predetermined period of time since the acquisition start time has elapsed (Yes in step Sa4), the processing circuitry 131 performs the processing in step Sa5.

(Step Sa5)

The processing circuitry 131 classifies, through the determination function 1317, the first MR signals into the multiple classes distinguished in accordance with a value of the body motion state. In more details, the processing circuitry 131 classifies the first MR signals acquired within the predetermined period of time into the multiple classes (the inspiration phase and the expiration phase) based on the obtained body motion state and the threshold. Specifically, among the plurality of first MR signals, the processing circuitry 131 associates with the expiration phase the first MR signals which correspond to the same acquisition time as the detection time corresponding to the position of the diaphragm greater than the threshold. The processing circuitry 131 may, among the plurality of first MR signals, associate with the inspiration phase the first MR signals which correspond to the same acquisition time as the detection time corresponding to the position of the diaphragm less than the threshold.

(Step Sa6)

The processing circuitry 131 specifies, through the determination function 1317, "a maximum class", which is a class in which a data amount of the first MR signals becomes the maximum among the multiple classes. If the body motion originates from respiration, since time intervals of the expiration phase are basically longer than those of the inspiration phase, the data amount of the first MR signals belonging to the expiration phase is larger than the data amount of the first MR signals belonging to the inspiration phase. For this reason, the processing circuitry 131 specifies the expiration phase as a maximum class.

(Step Sa7)

The processing circuitry 131 compares, courtesy of the determination function 1317, the data amount of the maximum class with the reference value. Instead of the reference value, a data amount of a predetermined class may be used for the comparison. In this case, the data amount of a predetermined class is stored in the memory 129 in place of the reference value. Specifically, with respect to the data amount of the first MR signals classified into the multiple classes according to a threshold that distinguishes a body motion state into the multiple classes, if the data amount in the maximum class, where a data amount is the largest among the multiple classes, is lower than the reference value, the processing circuitry 131 determines that additional acquisition is necessary. In more details, if the data amount of the expiration phase is smaller than the reference value (Yes in step Sa7), the processing circuitry 131 performs the processing in step Sa8. If the data amount of the expiration phase is larger than the reference value (No in step Sa7), the processing circuitry 131 performs the processing in step Sa9. By the processing from step Sa4 through step Sa7, the processing circuitry 131 determines whether or not additional acquisition of the second MR signals relating to the subject P is necessary based on the data amount of the first MR signals in accordance with the body motion state, after a predetermined period of time has elapsed since the first MR signal acquisition start time.

(Step Sa8)

The processing circuitry 131 adds, through the addition function 1319, the second trajectories which differ from the first MR signals belonging to the maximum class to an imaging protocol. Specifically, the processing circuitry 131 adds trajectories different from the first trajectories relating to the first MR signals belonging to the maximum class to the imaging protocol as second trajectories indicating the second acquisition positions. The second acquisition position is an acquisition position of the second MR signals in k-space acquired during additional acquisition. Specifically, the processing circuitry 131 specifies the first acquisition positions of the first MR signals belonging to the expiration phase. Subsequently, the processing circuitry 131 adds the second trajectories indicating the second acquisition positions, different from the first acquisition positions specified in k-space, to the imaging protocol. The processing circuitry 131 determines the second acquisition positions based on the first acquisition positions in k-space, in such a manner that the first acquisition positions and the second acquisition positions are uniformly distributed in k-space. If the change of the body motion state obtained by the obtaining function 1315 is approximately cyclic, the processing circuitry 131 may specify the second acquisition positions in k-space in consideration of the periodicity of the change in the body motion state.

Figure 4:
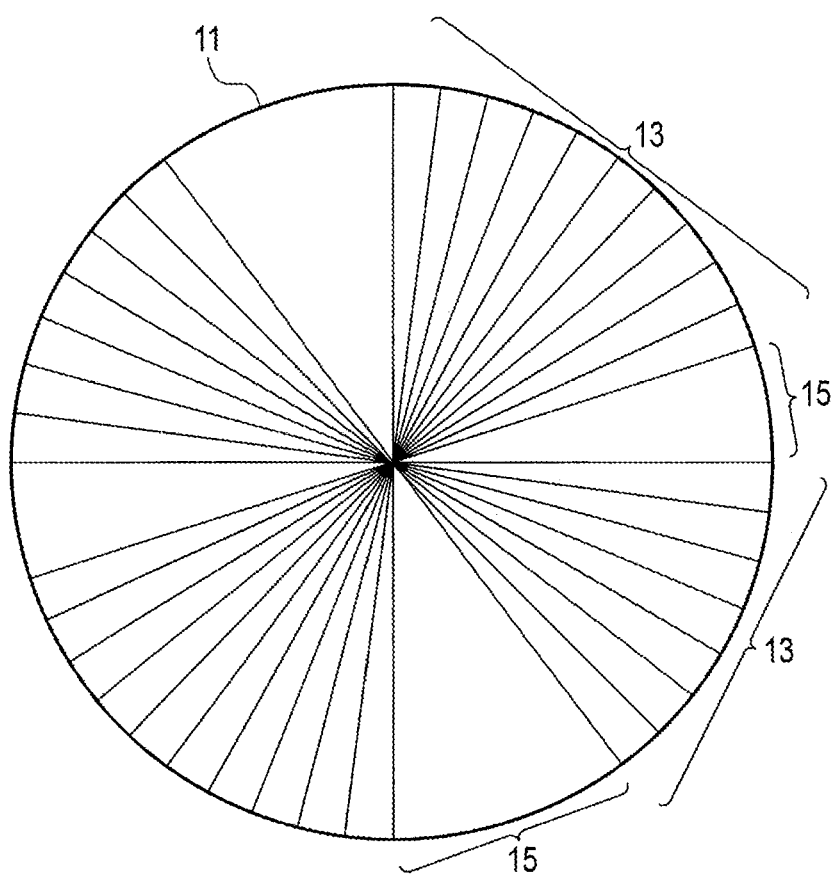
FIG. 4 is a diagram showing an example of first acquisition positions and second acquisition positions specified in k-space.

FIG. 4 is a diagram showing an example of a region 13 consisting of the first trajectories of the acquired first MR signals specified in the k-space 11. In FIG. 4, the trajectories are drawn as straight lines crossing the origin. As shown in FIG. 4, the region other than the region 13 in the k-space 11 is set as a region 15. In the region 15, second trajectories of the second MR signals targeted for acquisition in the additional acquisition are set. For example, the second trajectories are set in the region 15 from which the first MR signals are not acquired during the expiration phase.

The processing circuitry 131 may use, through the addition function 1319, an angle map to specify the second trajectories. The angle map is a map in which the trajectories of the MR signals are arranged in a one-dimensional space defined by the angles with respect to the origin of k-space.

Figure 5:
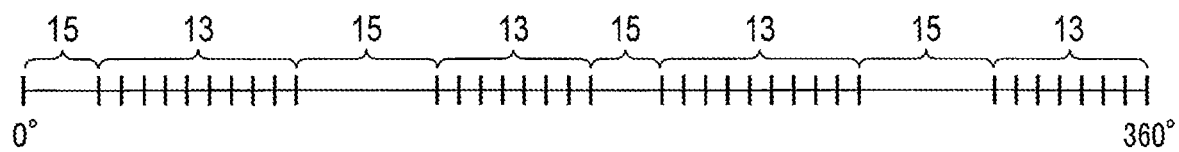
FIG. 5 is a diagram showing an example of an angle map used in an addition function.

FIG. 5 is a diagram showing an example of the angle map. As shown in FIG. 5, the processing circuitry 131 determines in the angle map the region 11, in which no first trajectories are present, as a region 15 in which the second trajectories may be set. For example, in the case of the map as shown in FIG. 5, the processing circuitry 131 arranges the second trajectories in the region 15 at the same intervals as those of the first trajectories in the region 11. Preferably, the second trajectories are determined in such a manner that an interval between the first trajectories and the second trajectories is uniform. If Cartesian scanning is adopted as a scanning scheme for the subject P, the processing circuitry 131 may determine the second trajectories using, instead of the angle map, a map in which the first trajectories are arranged in the phase encoding direction. With the other scanning schemes, the processing circuitry 131 can also determine the second trajectories.

Figure 6:
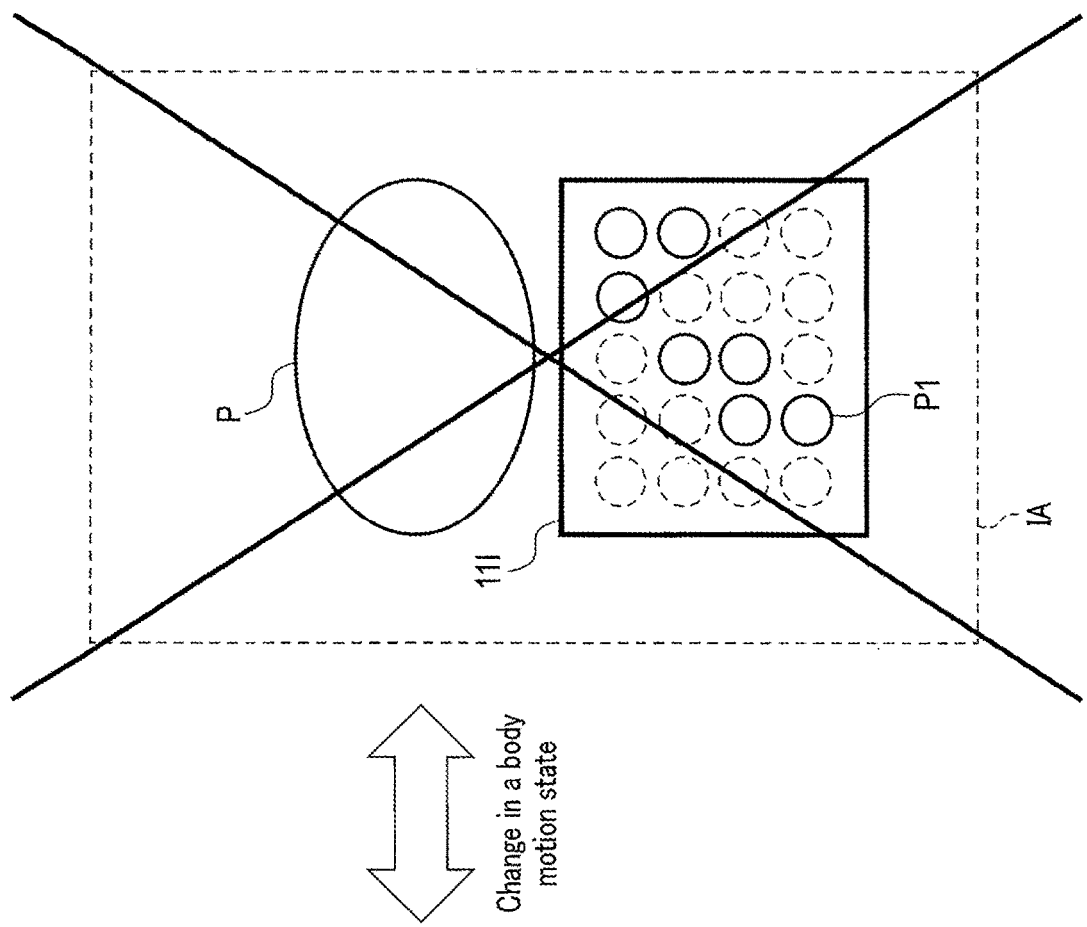
FIG. 6 is a diagram showing an example of first and second trajectories in k-space relating to an expiration phase and k-space relating to an inspiration phase in the embodiment.
Figure 6:
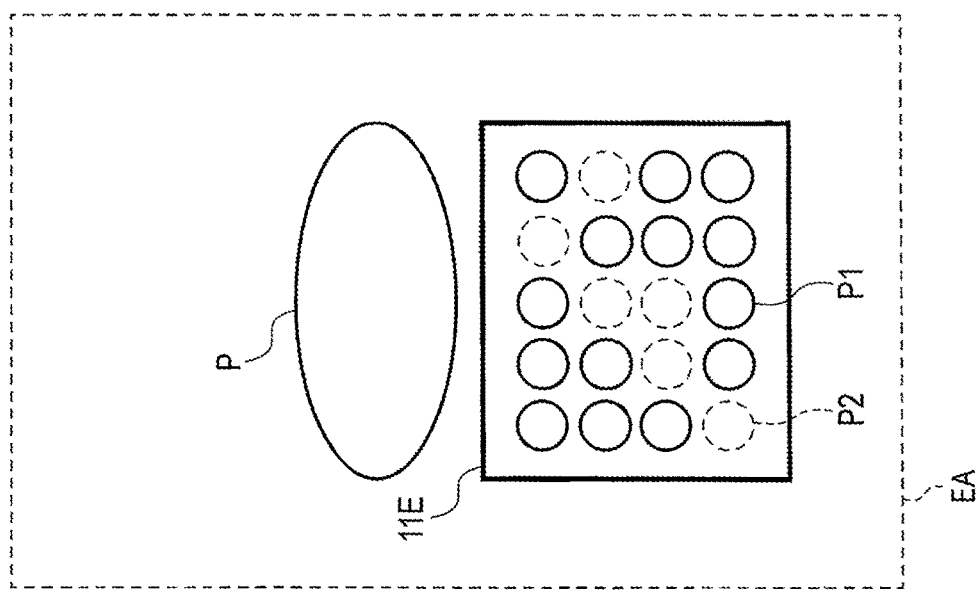

FIG. 6 is a diagram showing an example of the first trajectories P1 and the second trajectories P2 in the k-space 11E relating to the expiration phase EA and in the k-space 11I relating to the inspiration phase IA. As shown in FIG. 6, suppose the expiration phase EA is the maximum class. In the later step Sa11, the second MR signals corresponding to the second trajectories P2 in the k-space 11E relating to the expiration phase EA are acquired. The first MR signals in the inspiration phase IA, which is not the maximum class, may be discarded.

(Step Sa9)

The processing circuitry 131 causes, through the system control function 1311, the display 127 to display at least one of the following: the execution of additional acquisition; the extended imaging time; or the expected imaging finish time. Specifically, the processing circuitry 131 calculates the extended imaging time based on the total number of the second trajectories P2 belonging to additional acquisition. The processing circuitry 131 calculates the expected imaging finish time by adding the extended imaging time to the imaging time which is set based on the imaging condition in advance of the execution of the first MR signal acquisition. The display 127 displays the execution of additional acquisition, the calculated extended imaging time, and the calculated expected imaging finish time.

(Step Sa10)

The processing circuitry 131 determines, through the determination function 1317, whether or not the imaging time set as an imaging condition has elapsed. If the imaging time has not elapsed (No in step Sa10), the imaging control circuitry 121 performs the processing in step Sa2. Subsequently, the processing circuitry 131 repeats the processing in step Sa3 through step Sa10. At this time, the data amount of the maximum class in step Sa1 and the second trajectories in step Sa8 are updated. If the imaging time has elapsed (Yes in step Sa10), the imaging control circuitry 121 performs the processing in step Sa11.

(Step Sa11)

The imaging control circuitry 121 performs additional acquisition in accordance with the second trajectories, and acquires the second MR signals. In more details, the imaging control circuitry 121 performs MR imaging on the subject P in accordance with the second pulse sequence that includes the second trajectories, and acquires the second MR signals relating to the subject P. The imaging control circuitry 121 causes the memory 129 to store the acquired second MR signals along with the maximum class. Thus, at this time, the MR signals belonging to the maximum class include the first MR signals and the second MR signals. The processing circuitry 131 may, through the determination function 1317, classify the second MR signals into the multiple classes, and again perform the above-described determination made in step Sa1. The processing in step Sa11 may be performed in advance of the processing in step Sa10.

In step Sa11, the interface 125 may input an instruction to stop the additional acquisition via an operator's instruction. Upon an input of the instruction to stop the additional acquisition, the imaging control circuitry 121 stops the additional acquisition. In addition, upon the input of the instruction to stop, the processing circuitry 131 reconstructs an MR image based on the first MR signals and the second MR signals acquired until the instruction to stop is input.

(Step Sa12)

The processing circuitry 131 reconstructs an MR image based on the first and second MR signals belonging to the maximum class, through the reconstruction function 1321. Specifically, the processing circuitry 131 reconstructs an MR image corresponding to the expiration phase EA based on the first and second MR signals arranged in k-space KspE relating to the expiration phase EA. The processing circuitry 131 outputs the reconstructed MR image to the display 127 and the memory 129. The display 127 displays the reconstructed MR image.

According to the above-described structures and the additional acquisition execution process, the following advantages can be obtained.

According to the MRI apparatus 100 of the present embodiment, the following operations are performed: first trajectories indicating first acquisition positions of first MR signals in k-space are set; first MR signals relating to a subject P are sequentially acquired in accordance with the first trajectories; after a predetermined period of time has elapsed since a start time of the first MR signal acquisition, whether or not additional acquisition of second MR signals relating to the subject P is necessary is determined based on a data amount of the acquired first MR signals corresponding to a body motion state; if necessity of additional acquisition is determined, second trajectories indicating second acquisition positions relating to the additional acquisition in k-space are added to an imaging protocol; and an MR image can be reconstructed based on the first MR signals and the additionally-acquired second MR signals. At this time, according to the MRI apparatus 100, an MR image can be reconstructed with the use of parallel imaging, compression sensing, or a learned deep neural network, or any combination thereof.

Further according to the MRI apparatus 100, with respect to a data amount of first MR signals classified into multiple classes with the use of a threshold that distinguishes a body motion state into multiple classes, if a data amount of a maximum class, where a data amount is largest among the multiple classes, is smaller than a reference value, the MRI apparatus 100 determines that additional acquisition is necessary, and adds, to an imaging protocol as second trajectories, trajectories different from first trajectories relating to the first MR signals belonging to the maximum class, and reconstructs an MR image with the use of the first and second MR signals belonging to the maximum class. Further according to the MRI apparatus 100, the first trajectories are set as filling trajectories of radial scanning for the first MR signals in k-space, and second trajectories can be set so as not to overlap the first trajectories in advance of acquisition of the first MR signals.

Further according to the MRI apparatus 100, if necessity of additional acquisition is determined, at least one of the execution of additional acquisition, an imaging time increased by the execution of additional acquisition, or an expected imaging finish time which includes additional acquisition is displayed on the display 127. Further according to the MRI apparatus 100, an instruction to stop additional acquisition can be input, and the execution of additional acquisition can be stopped upon an input of the instruction to stop; and upon the input of the instruction to stop, an MR image can be reconstructed based on first and second MR signals acquired until the input of the instruction to stop.

Thus, according to the MRI apparatus 100, if a data amount of MR signals necessary to guarantee image quality of an MR image at an operator's desired level is found lacking in a maximum class among multiple classes classified based on an imaging target's body motion state originating from body motion of a subject P, it is possible to execute additional imaging so as to compensate for the insufficient data amount, and image quality of an MR image can be guaranteed. According to the MRI apparatus 100, since information regarding additional acquisition can be provided to an operator, the operator can thereby stop additional acquisition and reconstruct an MR image at his or her discretion. It is thereby possible to adjust the increase in an imaging time caused by the execution of additional acquisition as appropriate in accordance with an operator's instruction.

First Modification

In the processing circuitry 131 according to the first modification, whether or not additional acquisition is necessary is determined for each of the multiple classes, and an MR image corresponding to each of the multiple classes is reconstructed with the use of the first and second MR signals belonging to each of the multiple classes.

Figure 7:
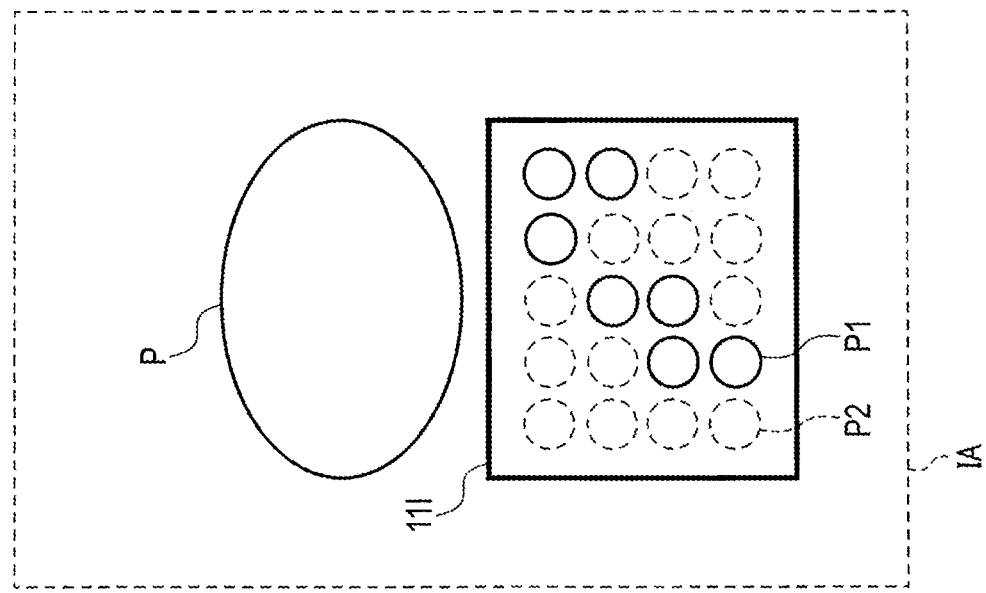
FIG. 7 is a diagram showing an example of first and second trajectories in k-space relating to an expiration phase and k-space relating to an inspiration phase according to a first modification.
Figure 7:
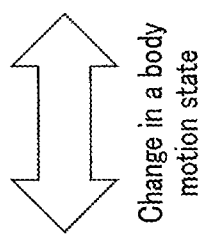
Figure 7:
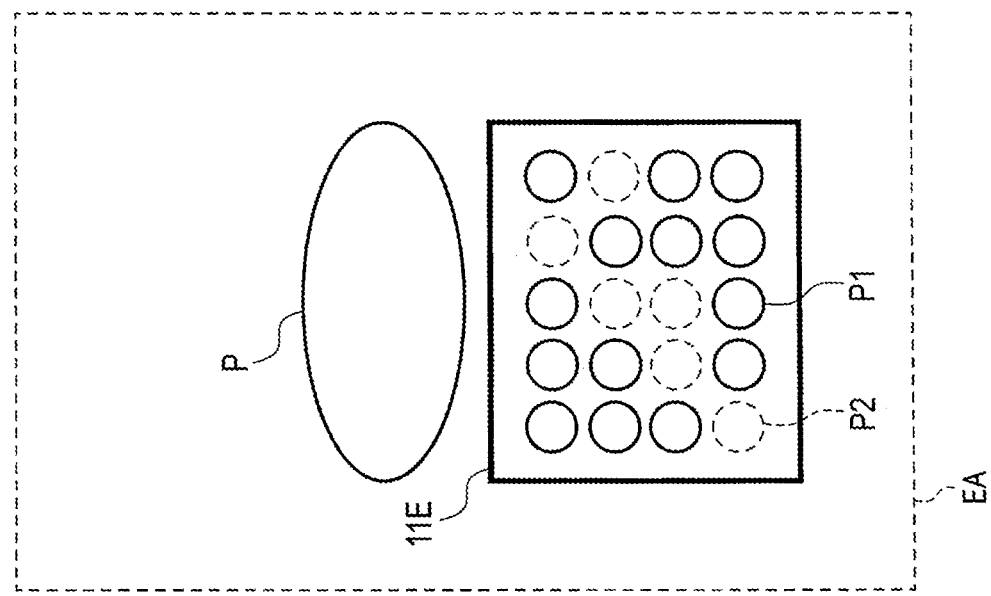

FIG. 7 is a diagram showing an example of the first trajectories P1 and the second trajectories P2 in the k-space 11E relating to the expiration phase EA and in the k-space 11I relating to the inspiration phase IA. As shown in FIG. 7, in the present modification, the first MR signals in the inspiration phase IA are not discarded, and are rather used for reconstruction of an MR image corresponding to the inspiration phase IA.

Figure 9:
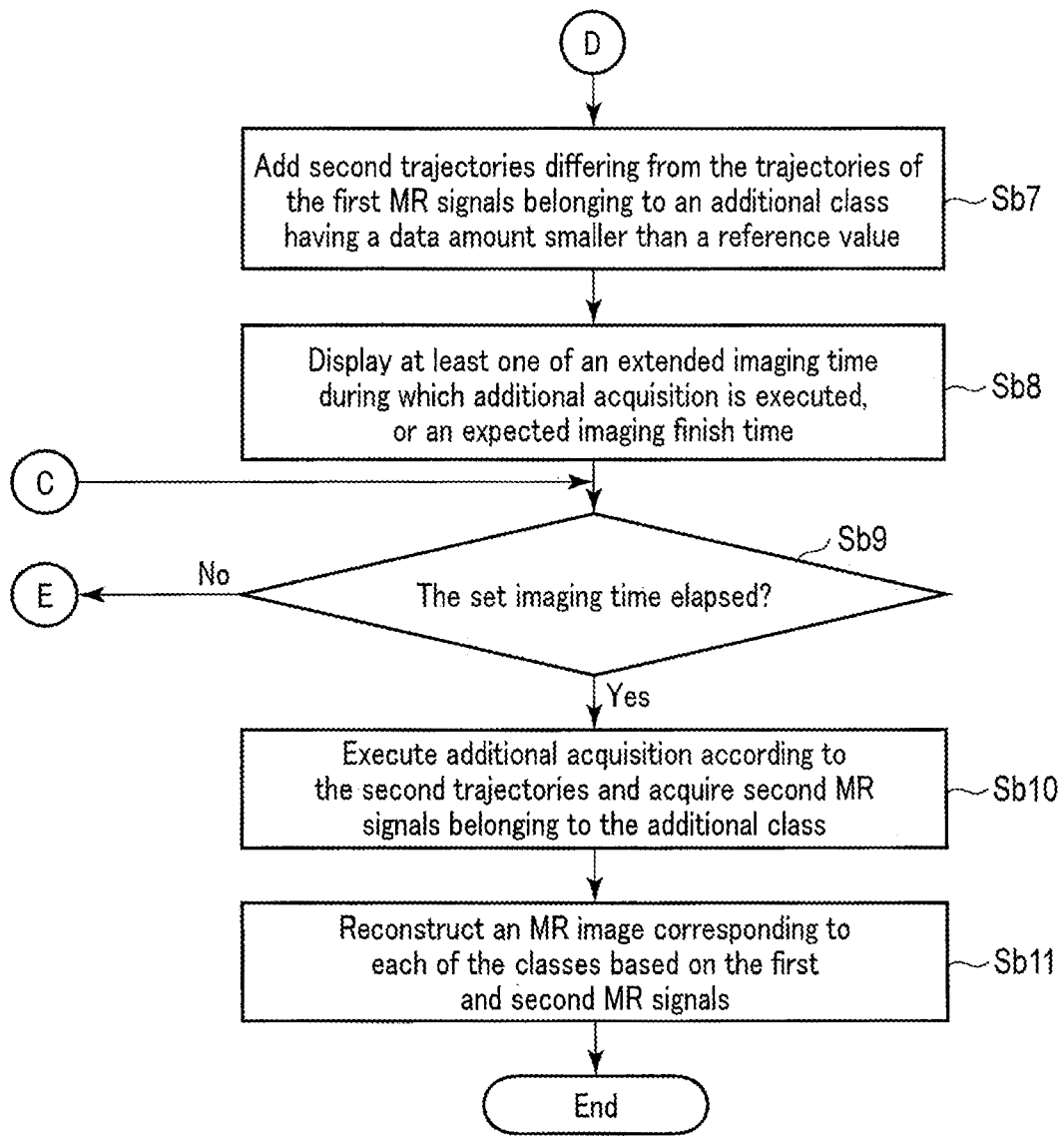
FIG. 9 is a flow chart showing an example of a procedure of an additional acquisition execution process according to the first modification.

In the following, the additional acquisition execution process of the present modification will be described. FIGS. 8 and 9 are flow charts showing an example of a procedure of the additional acquisition execution process according to the present modification. Since the processing in step Sb1 through step Sb5 and step Sb8 in FIG. 8 is the same as the processing in step Sa1 through step Sa5 and step Sa9 in FIG. 2, the description thereof is omitted.

(Step Sb6)

The processing circuitry 131 compares, through the determination function 1317, a data amount of the first MR signals belonging to each of the multiple classes with a reference value. Specifically, with respect to the data amount of the first MR signals classified into the multiple classes, if the data amount in at least one of the multiple classes is lower than the reference value, the processing circuitry 131 determines that additional acquisition is necessary. In more details, if the data amount of the expiration phase EA is smaller than the reference value (Yes in step Sb6), the processing circuitry 131 performs the processing in step Sb7. If the data amount of the inspiration phase IA is smaller than the reference value (Yes in step Sb6), the processing circuitry 131 performs the processing in step Sb7. If both the data amount of the expiration phase EA and the data amount of the inspiration phase IA are larger than the reference value (No in step Sb6), the processing circuitry 131 performs the processing in step Sb9.

(Step Sb7)

The processing circuitry 131 adds, to an imaging protocol, through the addition function 1319, trajectories different from the first trajectories relating to the first MR signals belonging to a class having a data amount smaller than a reference value (hereinafter, "additional class") as second trajectories relating to additional acquisition, along with the associated additional class. Specifically, the processing circuitry 131 specifies the first acquisition positions of the first MR signals belonging to the additional class. Subsequently, the processing circuitry 131 adds the second trajectories indicating the second acquisition positions differing from the first acquisition positions specified in k-space, to the imaging protocol. Through the processing, the processing circuitry 131 can add, to an imaging protocol, the second trajectories differing from the first trajectories relating to the first MR signals belonging to the additional class relating to additional acquisition. Since the processing in this step performed to each additional class is the same as the processing in step Sa8, the detailed description of the processing is omitted.

(Step Sb9)

The processing circuitry 131 determines, through the determination function 1317, whether or not the imaging time set by an imaging condition has elapsed. If the imaging time has not elapsed (No in step Sb9), the imaging control circuitry 121 performs the processing in step Sb2. Subsequently, the processing circuitry 131 repeats the processing in step Sb3 through step Sb9. At this time, the data amounts of each of the multiple classes in step Sb6 and the second trajectories in step Sb7 are updated. If the imaging time has elapsed (Yes in step Sb9), the imaging control circuitry 121 performs the processing in step Sb10.

(Step Sb10)

The imaging control circuitry 121 performs additional acquisition in accordance with the second trajectories, and acquires the second MR signals belonging to the additional class. The imaging control circuitry 121 causes the memory 129 to store the acquired second MR signals along with the additional class. Thus, at this time, the MR signals belonging to the additional class include the first MR signals and the second MR signals. After the processing in this step, the processing circuitry 131 may, through the determination function 1317, classify the second MR signals into the multiple classes, and perform once again the above-described determination made in step Sb6. The processing in this step may be performed in advance of the processing in step Sb9.

(Step Sb11)

The processing circuitry 131 reconstructs, through the reconstruction function 1321, a plurality of MR images respectively corresponding to the multiple classes based on the first and second MR signals belonging to each of the multiple classes. Specifically, the processing circuitry 131 reconstructs an MR image corresponding to the expiration phase based on the first and second MR signals arranged in k-space relating to the expiration phase. The processing circuitry 131 reconstructs an MR image corresponding to the inspiration phase based on the first and second MR signals arranged in k-space relating to the inspiration phase. The processing circuitry 131 outputs the reconstructed MR image to the display 127 and the memory 129. The display 127 displays the reconstructed MR image.

According to the MRI apparatus 100 of the first modification, with respect to a data amount of first MR signals classified into multiple classes with the use of a threshold that distinguishes a body motion state into the multiple classes, if a data amount of at least one class among the multiple classes is smaller than a reference value, the MRI apparatus 100 determines that additional acquisition is necessary, and adds second trajectories differing from first trajectories relating to the first MR signals belonging to the class relating to the additional acquisition to an imaging protocol, and reconstructs an MR image corresponding to each of the multiple classes with the use of the first and second MR signals classified into the multiple classes.

Thus, according to the MRI apparatus 100, if a data amount of MR signals necessary to guarantee image quality of an MR image at an operator's desired level is found lacking in each of the multiple classes distinguished based on a body motion state of a subject P, it is possible to execute additional imaging so as to compensate for an insufficient data amount, and thereby guarantee image quality of the MR image.

Second Modification

The processing circuitry 131 according to the second modification obtains a body motion state with the use of an MR image, without recourse to any external device, such as a respiration belt or an optical camera. The processing according to the second modification is performed in step Sa3 of FIG. 2 and step Sb3 of FIG. 8. In the additional acquisition execution process according to the second modification, step Sa3 of FIG. 2 is performed after step Sa4 of FIG. 2, and step Sb3 of FIG. 8 is performed after step Sb4 of FIG. 8.

The processing circuitry 131 reconstructs, through the reconstruction function 1321, an MR image (hereinafter, "reference image") based on the first MR signals (hereinafter "reference MR signals") acquired within a reference period which is shorter than a total period during which sequential acquisition of the first MR signals is performed. The reference period corresponds to a predetermined period of time referred to in step Sa4 and step Sb4. The reference period may be shorter than the predetermined period of time. Subsequently, the processing circuitry 131 reconstructs partial images respectively corresponding to a plurality of partial periods based on the first MR signals (hereinafter "partial MR signals") acquired within each of a plurality of partial periods, which are shorter than the predetermined period of time or the reference time. The reference period and the partial periods are stored in the memory 129.

Figure 10:
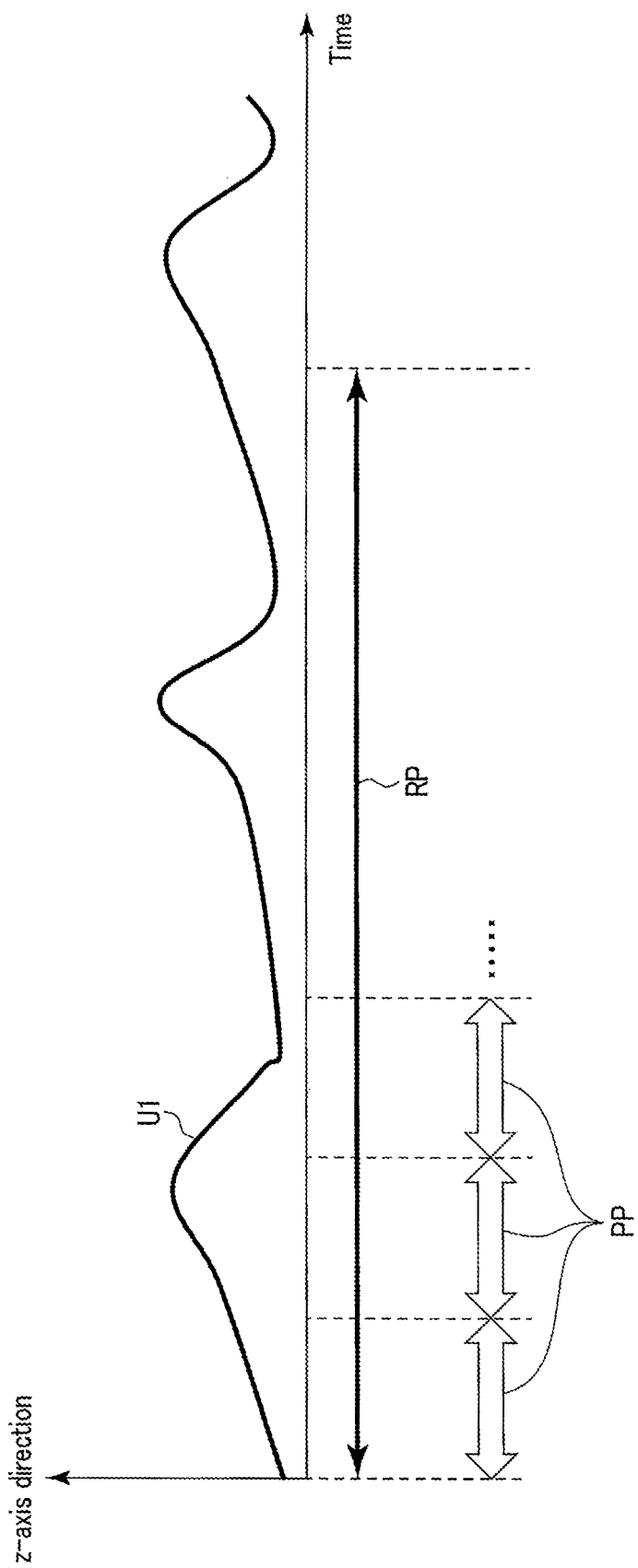
FIG. 10 is a diagram showing an example of a temporal change of a position of a diaphragm, a reference period, and partial periods, which are used in a second modification.

FIG. 10 is a diagram showing an example of a temporal change of a position U1 of a diaphragm, a reference period RP, and partial periods PP. As shown in FIG. 10, the diaphragm in the reference image reconstructed with the use of the reference MR signals belonging to the reference period RP can be imaged at a position average of the position U1 of the diaphragm over the reference period RP. On the other hand, the diaphragm in each of the plurality of partial images, which are reconstructed with the use of the partial MR signals belonging to the partial periods PP, is imaged at a position average of the position U1 of the diaphragm in each of the partial periods PP. The plurality of partial periods PP shown in FIG. 10 do not overlap each other; however, each partial period PP may overlap with its neighboring partial period through an extension of the partial period with respect to its center.

The processing circuitry 131 performs positioning of the reference image and the plurality of partial images through the obtaining function 1315. The processing circuitry 131 determines, through the positioning, a relative position of the diaphragm in each of the partial images with respect to the position of the diaphragm in the reference image. The relative position corresponds to a difference between the positions of the diaphragm along with the z-axis direction, for example. The processing circuitry 131 obtains a body motion state based on the relative position and the threshold. If the multiple classes consist of two classes, the expiration phase and the inspiration phase, the threshold for distinguishing the body motion state of the subject P into the multiple classes corresponds to the position of the diaphragm in the reference image. If there are three or more classes, a plurality of thresholds may be determined by multiplying a predetermined coefficient with the position of the diaphragm. In the foregoing cases, it is unnecessary to store the thresholds in the second modification.

The processing circuitry 131 may obtains, through the obtaining function 1315, a body motion state with the use of a learned model into which the reference image and the plurality of partial images are input, and which is learned so as to output a body motion state. The learned model may be realized by, for example, a deep neural network, a convolutional neural network (CNN), etc.

According to the MRI apparatus 100 of the second modification, the following operations are performed: a reference image is reconstructed based on reference MR signals acquired within a reference period shorter than a total period during which sequential acquisition of first MR signals is performed; partial images respectively corresponding to a plurality of partial periods are reconstructed based on partial MR signals acquired in the partial periods shorter than the reference period; and a body motion state can be obtained through the positioning of the reference image and the partial images.

Thus, a body motion state of the subject P can be obtained without requiring the subject P to wear a respiration belt, etc., and it is thereby possible to reduce the burden on the subject P during the MR imaging. Furthermore, since a body motion state of the subject P can be obtained without using an external device such as an optical camera, it is possible to reduce the cost involved in the acquisition of a body motion state.

Third Modification

The processing circuitry 131 according to the third modification obtains a body motion state with the use of a non-reconstructed MR image, without using any external device, such as a respiration belt or an optical camera. The processing according to the third modification is performed in step Sa3 of FIG. 2 and step Sb3 of FIG. 8. In the additional acquisition execution process according to the third modification, step Sa3 of FIG. 2 is performed after step Sa4 of FIG. 2, and step Sb3 of FIG. 8 is performed after step Sb4 of FIG. 8.

The processing circuitry 131 generates, through the obtaining function 1315, first non-reconstructed image data based on the reference MR signals. The processing circuitry 131 generates second non-reconstructed image data corresponding to each of the plurality of partial periods based on the partial MR signals. To make the description hereinafter concrete, suppose the MR data corresponding to the reference MR signals (hereinafter "reference MR data") and the MR data corresponding to the partial MR signals (hereinafter "partial MR data") are three-dimensional data defined in, for example, the kx, ky, kz directions. The processing circuitry 131 obtains first non-reconstructed image data by performing Fourier transform on the reference MR data in the kz direction.

Similarly, the processing circuitry 131 obtains, through the obtaining function 1315, second non-reconstructed image data by performing Fourier transform on the partial MR data in the kz direction. At this time, the first non-reconstructed image data and the second non-reconstructed image data correspond to projection data generated by projecting the MR image to a z direction from a direction perpendicular to the z direction. The first non-reconstructed image data and the second non-reconstructed image data are not limited to projection data, and may be MR data.

FIG. 11 is a diagram showing an example of the projection image I1. The projection image I1 is generated by arranging the second non-reconstructed image data obtained at different acquisition times, along a time axis. As shown in FIG. 11, the position of the diaphragm corresponds to the boundary DL where contrast changes. The second non-reconstructed image data corresponding to the projection data may be obtained using a navigation echo method, for example. FIG. 12 is a diagram showing an acquisition range NEA of the navigation echo method shown in the locator image 12.

The processing circuitry 131 performs positioning of the first non-reconstructed image data and the second non-reconstructed image data, through the obtaining function 1315. Through the positioning, the processing circuitry 131 determines a relative position of the diaphragm in the second non-reconstructed image data with respect to the position of the diaphragm in the first non-reconstructed image data. The processing circuitry 131 obtains a body motion state based on the relative position and the threshold. If the multiple classes consist of two classes, the expiration phase and the inspiration phase, the threshold for distinguishing the body motion state of the subject P into the multiple classes corresponds to the position of the diaphragm in the first non-reconstructed image data. If there are three or more classes, a plurality of thresholds may be determined by multiplying a predetermined coefficient with the position of the diaphragm. In the foregoing cases, it is unnecessary to store the thresholds in the present modification.

The processing circuitry 131 may obtain, through the obtaining function 1315, a body motion state with the use of a learned model into which the second non-reconstructed image data and MR data corresponding to the first MR signals are input, and which is learned so as to output a body motion state. The processing circuitry 131 may classify, through the determination function 1317, the first MR signals with the use of a learned model into which the first MR signals and the second non-reconstructed image data are input, and from which classified first MR signals are output.

According to the MRI apparatus 100 of the third modification, a body motion state can be obtained by performing the positioning of first non-reconstructed image data based on reference MR signals acquired within a reference period shorter than a total period during which sequential acquisition of first MR signals is performed, and second non-reconstructed image data respectively corresponding to a plurality of partial periods based on partial MR signals acquired in the partial periods shorter than the reference period.

Fourth Modification

The processing circuitry 131 according to the fourth modification reconstructs an MR image (hereinafter, "state image") corresponding to a body motion state based on the first MR signals belonging to each body motion state, and determines whether or not additional acquisition is necessary based on noise intensity in the state image. The processing according to the fourth modification is performed instead of the processing in step Sa1 in FIG. 2 and in step Sb6 of FIG. 8 in the additional acquisition execution process.

The processing circuitry 131 reconstructs, through the reconstruction function 1321, a state image corresponding to a body motion state based on the first MR signals for each body state motion. Specifically, the processing circuitry 131 reconstructs a state image corresponding to each of the multiple classes based on the first MR signals belonging to each of the multiple classes. In step Sa1 of FIG. 2, the processing circuitry 131 reconstructs a state image corresponding to a maximum class based on the first MR signals belonging to the maximum class.

The processing circuitry 131 determines, through the determination function 1317, whether or not additional acquisition is necessary based on noise intensity of the state image. Specifically, the processing circuitry 131 generates a denoised image by applying a denoise filter to the state image. The processing circuitry 131 calculates a sum of the square of the pixel values of the state image and the denoised image as noise intensity. The processing circuitry 131 compares a noise threshold stored in the memory 129 with the noise intensity, and if the noise intensity is greater than the noise threshold, determines that additional acquisition is necessary.

The processing circuitry 131 does not necessarily reconstruct the state image in order to specify noise intensity. For example, the processing circuitry 131 may specify, as noise intensity, data of an edge portion of k-space where the first MR signals are arranged. In this case, the noise threshold corresponds to, for example, a signal acquired by the reception circuitry 119 without applying a transmit RF wave to the subject P.

The processing circuitry 131 may determine whether or not additional acquisition is necessary, courtesy of the determination function 1317, with the use of a learned model into which the state image or the first MR signals belonging to each of the multiple classes, and which is learned so as to output whether or not additional acquisition is necessary. The learned model is a machine learning model, such as a deep neural network, a support vector machine, or random forest.

According to the MRI apparatus 100 of the fourth modification, a state image corresponding to a body motion state based on the first MR signals for the body motion state can be reconstructed, and whether or not additional acquisition is necessary can be determined based on noise intensity of the state image. Since the necessity of additional acquisition is determined based on the noise intensity of the MR image, it is possible to reconstruct an MR image with high quality and reduced noise.

Fifth Modification

The processing circuitry 131 according to the fifth modification reconstructs a state image corresponding to a body motion state based on the first MR signals belonging to each body motion state, and determines whether or not additional acquisition is necessary based on a detected amount of artifact included in the state image. The processing according to the fifth modification is performed instead of the processing in step Sa1 in FIG. 2 and in step Sb6 of FIG. 8 in the additional acquisition execution process.

The processing circuitry 131 reconstructs, through the reconstruction function 1321, a state image corresponding to a body motion state based on the first MR signals for each body state motion. Specifically, the processing circuitry 131 reconstructs a state image corresponding to each of the multiple classes based on the first MR signals belonging to each of the multiple classes. In step Sa1 of FIG. 2, the processing circuitry 131 reconstructs a state image corresponding to a maximum class based on the first MR signals belonging to the maximum class.

The processing circuitry 131 determines, through the determination function 1317, whether or not additional acquisition is necessary based on a detected amount of artifact included in a state image. Specifically, the processing circuitry 131 detects artifact in a state image using a filter for detecting artifact (hereinafter "detection filter"). The detection filter may be stored in advance in the memory 129 for each scanning method, for example. The processing circuitry 131 may detect artifact through performing template matching on the state image, with the use of a template indicating a shape of typical artifact.

FIG. 13 is a diagram showing an example of body motion artifact MAR drawn on a partial image in a case when the scanning scheme is radial scanning. FIG. 14 is a diagram showing an example of body motion artifact MAC drawn on a partial image in a case when the scanning scheme is Cartesian scanning. As shown in FIGS. 13 and 14, an insufficient data amount in the maximum class may appear as artifact in the state image.

The processing circuitry 131 calculates a detected amount of artifact in the state image, with the use of the detected artifact. A detected amount of artifact is, for example, the number of pixels included in an artifact region in the state image. The processing circuitry 131 compares a threshold stored in the memory 129 with the detected amount of artifact, and if the detected amount of artifact is greater than the threshold, determines that additional acquisition is necessary.

The processing circuitry 131 may determine whether or not additional acquisition is necessary courtesy of the determination function 1317, with the use of a learned model into which the state image or the first MR signals belonging to each of the multiple classes is input, and which is learned so as to output whether or not additional acquisition is necessary. The learned model is a machine learning model, such as a deep neural network, a support vector machine, or random forest, etc.

According to the processing circuitry 100 of the fifth modification, a state image corresponding to a body motion state based on the first MR signals belonging to the body motion state can be reconstructed, and whether or not additional acquisition is necessary can be determined based on a detected amount of artifact in the state image. Since the necessity of additional acquisition is determined based on a detected amount of artifact in an MR image, and not on a data amount of a maximum class, it is possible to reconstruct an MR image with high image quality and reduced artifact.

Sixth Modification

The imaging control circuitry 121 according to the sixth modification performs additional acquisition subsequently to the sequential acquisition of the first MR signals. Whether or not to execute additional acquisition subsequently to the sequential acquisition may be selected depending on a sequence type of the sequential acquisition. For example, if the sequential acquisition is executed in accordance with a gradient echo-type sequence, the processing according to the sixth embodiment is performed.

The processing circuitry 131 determines, through the determination function 1317, whether or not additional acquisition is necessary after a predetermined period of time is elapsed, and before a time determined by subtracting a time required for determining whether or not additional acquisition is necessary and adding second trajectories to the imaging protocol (hereinafter "additional determination time") from an expected finish time for the sequential acquisition of first MR signals (hereinafter "determination start limit time"). The additional determination time is stored in the memory 129 in advance. Specifically, the processing circuitry 131 calculates a time required for the sequential acquisition of the first MR signals (hereinafter "sequential acquisition time") based on the imaging conditions, prior to the execution of the sequential acquisition. The processing circuitry 131 calculates an expected finish time by adding the sequential acquisition time to the acquisition start time, which corresponds to the time when step Sa2 starts. The processing circuitry 131 calculates a determination start limit time by subtracting the additional determination time from the expected finish time. The processing circuitry 131 determines whether or not additional acquisition is necessary after the predetermined period of time has elapsed and before the determination start limit time arrives.

FIG. 15 is a diagram showing an example of the acquisition start time Ts1, the predetermined period of time PT, the finish time of the predetermined period of time Tppt, the determination start limit time Tbdt, the additional determination time DT, and the start time of additional acquisition Ts2, in the additional acquisition execution process. As shown in FIG. 15, the processing circuitry 131 performs the determination on whether or not additional acquisition is necessary between the finish time of the predetermined period of time Tppt and the determination start limit time Tbdt.

According to the MRI apparatus 100 of the sixth modification, in order to execute additional acquisition subsequently to sequential acquisition of first MR signals, it is possible to determine whether or not additional acquisition is necessary between a time after a predetermined period of time has elapsed and a time determined by subtracting a time required for determining whether or not additional acquisition is necessary and for adding second trajectories to an imaging protocol from an expected finish time for the sequential acquisition. It is thereby possible to execute additional acquisition under a condition identical to the magnetization at the time of transmitting a transmit RF wave during the acquisition of first MR signals. It is thereby unnecessary to apply a dummy RF pulse, in which no MR signals are acquired, in order to stabilize the magnetization after T1 recovery to the subject P when the additional acquisition is started; thus, an imaging total time including the additional acquisition can be shortened.

In the case where the sequential acquisition and the additional acquisition are not subsequently performed, sound originating from MR signal acquisition is stopped or lowered in a transition from the sequential collection to the additional acquisition. This leads to a possibility that the subject P may erroneously recognize that the examination he or she is undergoing is finished. According to the MRI apparatus 100 of the sixth modification on the other hand, since the sequential acquisition of first MR signals and the additional acquisition are subsequently performed, sound originating from MR signal collection (hereinafter, "acquisition sound") can be generated without interruption. Thus, the subject P would not erroneously recognize the end of examination when the acquisition sound stops; therefore, psychological burden on the subject P can be determined.

Seventh Modification

The processing circuitry 131 of the seventh modification, upon an operator's input of an imaging total time including the sequential acquisition of the first MR signals and the additional acquisition via the interface 125, determines second trajectories based on the imaging total time and first trajectories.

Prior to the processing in step Sa1 of the additional acquisition execution process, or between the acquisition start time and the time when the predetermined period of time elapses, an imaging total time is input by an operator's input via the interface 125. The imaging total time corresponds to an upper limit time of imaging performed to the subject P. Instead of the imaging total time, an extended imaging time may be input.

The processing circuitry 131 determines, through the addition function 1319, second trajectories based on the imaging total time (or the extended imaging time) and the first trajectories. Specifically, the processing circuitry 131 determines the number of the second trajectories based on the imaging total time (or the extended imaging time). Subsequently, the processing circuitry 131 determines an imaging condition regarding the second trajectories in such a manner that the first trajectories and the second trajectories are uniformly arranged in k-space. For example, if the first trajectories are arranged in the k-space 11 as shown in FIG. 4, and the two regions CP2 in which the plurality of first trajectories are not present in the k-space 11 exist in the ratio of 1:2, and the extended imaging time based on the imaging total time is a time during which additional acquisition is executable along 3n (n is a natural number) second trajectories, the processing circuitry 131 determines an imaging condition in such a manner that n second trajectories are uniformly arranged in a narrower region of the two regions CP2, and determines an imaging condition in such a manner that 2n second trajectories are uniformly arranged in a wider region.

According to the MRI apparatus 100 of the seventh modification, an imaging total time including the sequential acquisition of the first MR signals and the additional acquisition is input, and second acquisition positions can be determined based on first acquisition positions and the input imaging total time. Since it is possible to control an additional amount of the second trajectories based on an upper limit of an imaging time, the first trajectories and the second trajectories can be arranged in k-space as uniformly as possible within an operator's desired imaging total time. According to the MRI apparatus 100, it is thereby possible to generate an MR image having improved image quality within an imaging total time limited by the operator.

Eighth Modification

The processing circuitry 131 according to the eighth modification applies the additional acquisition execution process to the case where there are multiple factors accounting for subject P's body motion. To make the description concrete, hereinafter suppose the factors of the body motion originate from heart pulsation and respiration.

FIG. 16 is a drawing showing an example of a respiration waveform RWF and an electrocardiograph waveform EWF. The memory 129 stores, as a threshold for distinguishing the first MR signals into multiple classes corresponding to a body motion state, three thresholds for distinguishing the first MR signals into four states (a state where an expiration phase EA and a contraction time are present; a state where an expiration phase EA and an expansion time are present; a state where an inspiration phase IA and a contraction time are present; and a state where an inspiration phase IA and an expansion time are present) in accordance with a body motion state.

Since the additional acquisition execution process is the same as that described in the foregoing embodiment and first modification, etc., the description thereof is omitted. The processing circuitry 131 may perform the classification of the first MR signals in accordance with a body motion state via a gating method using an electrocardiograph waveform EWF or a respiration waveform RWF. With the gating method, the processing circuitry 131 may discard the first MR signals belonging to a body motion state which do not originate from an imaging target.

Application Example

The processing circuitry 131 of an application example calculates an upper limit of a sum of a data amount of the first MR signals and a data amount of the second MR signals (hereinafter, an acquired data amount) based on a specific absorption rate (SAR), and stops additional acquisition, and reconstructs an MR image when the acquired data amount reaches the upper limit during execution of additional acquisition.

FIG. 17 is a diagram showing an example of a configuration of the processing circuitry 131 according to the application example. As shown in FIG. 17, the processing circuitry 131 further includes a calculation function 1323, in addition to the above-described functions, namely the system control function 1311, the setting function 1313, the obtaining function 1315, the determination function 1317, the addition function 1319, and the reconstruction function 1321. The calculation function 1323 is stored in the memory 129 in a form of program executable by a computer. The processing circuitry 131 reads a program corresponding to the calculation function 1323 from the memory 129 and executes the program to realize the calculation function 1323 corresponding to the program. The calculation function 1323 of the processing circuitry 131 is an example of a calculator.

The processing circuitry 131 calculates, through the calculation function 1323, an upper limit (hereinafter "upper-limit data amount") of a sum (hereinafter "sum data amount") of a data amount of the first MR signals (hereinafter "first data amount") and a data amount of the second MR signals (hereinafter "second data amount") based on an SAR (hereinafter "upper-limit SAR") of the subject P and imaging conditions, determined in advance of the first MR signal acquisition. For example, the processing circuitry 131 determines an acquirable second data amount (hereinafter "acquirable data amount") in such a manner that the SAR of the sequential acquisition of the first MR signals and the additional acquisition of the second MR signals is lower than the upper-limit SAR. If the acquirable data amount is zero, the processing circuitry 131 may cause the display 127 to display that additional acquisition is impossible. The processing circuitry 131 calculates a first data amount based on the imaging conditions. The processing circuitry 131 calculates a sum of the first data amount and the acquirable data amount as the upper-limit data amount. The processing circuitry 131 calculates, through the calculation function 1323, a sum data amount at the time of the second MR signal acquisition in the additional acquisition execution process.

The processing circuitry 131 further determines, through the determination function 1317, whether or not the sum data amount reaches the upper-limit data amount at the time when additional acquisition is executed. When the sum data amount reaches the upper-limit data amount, the processing circuitry 131 outputs an instruction to stop the additional acquisition (hereinafter "acquisition stop instruction") to the imaging control circuitry 121.

The imaging control circuitry 121 stops the additional acquisition when the sum data amount reaches the upper-limit data amount, in other words, in response to the input of the cessation of acquisition instruction from the processing circuitry 131. At this time, the display 127 may display the cessation of the additional acquisition.

When the sum data amount reaches the upper-limit data amount, the processing circuitry 131 reconstructs, through the reconstruction function 1321, the MR image using the first MR signals and the second MR signals.

According to the MRI apparatus 100 of the application example, an upper limit of a sum of a data amount of first MR signals and a data amount of second MR signals can be calculated based on a specific absorption rate of the subject P determined in advance of the acquisition of the first MR signals and imaging conditions, and whether or not the sum reaches the upper limit at the time of execution of additional acquisition can be further determined. When the sum reaches the upper limit, the additional acquisition can be stopped, and an MR image can be reconstructed.

Thus, the MRI apparatus 100 can execute additional acquisition within an upper-limit SAR determined in advance of the imaging of the subject P; it is therefore possible to secure safety for the subject P and image quality of an MR image.

Others

According to some of the foregoing embodiment and modifications, an MRI apparatus 100 includes imaging control circuitry 121 and processing circuitry 131. The imaging control circuitry 121 acquires MR signals in accordance with a first pulse sequence set in an imaging protocol.

The processing circuitry 131 determines, during acquisition according to the first pulse sequence, whether or not additional acquisition of MR signals is necessary in accordance with a determination of image quality based on the acquired MR signals. If it is determined that additional acquisition is necessary, the processing circuitry 131 adds a second pulse sequence for the additional acquisition to the imaging protocol. The imaging control circuitry 121 acquires MR signals in accordance with the added second pulse sequence. The processing circuitry 131 reconstructs an MR image based on the MR signals acquired according to the first pulse sequence and the second pulse sequence.

In some of the foregoing embodiment and modifications, the processing circuitry 131 estimates whether there is a lack in a data amount of MR signals during the execution of the first pulse sequence, and if it is estimated that there is a lack in the data amount, adds a second pulse sequence to the imaging protocol which is under operation. The second pulse sequence is performed sequentially to the first pulse sequence, or after a certain period of time. According to this processing, automatic data acquisition is performed until a data amount of MR signals necessary for reconstruction is acquired.

The processing circuitry 131 in some of the foregoing embodiment and modifications determines whether or not additional imaging is necessary by comparing a data amount of MR signals with a reference value. However, the embodiment is not limited to this. The processing circuitry 131 may determine whether or not additional imaging is necessary with the use of a learned model.

FIG. 18 is a diagram schematically showing an example of an input and output of a learned model according to another example. As shown in FIG. 18, the learned model is learned so as to output an allowable image quality level from an input of an MR image to the model. The learned model is for example a neural network having two or more layers. The architecture of the neural network includes, for example, one or more CNNs, one or more fully-connected layers, and a classifier. The architecture of the neural network according to the present embodiment is not limited to this example, and may be of any architecture as long as it can output an allowable image quality level from an MR image input to the network.

An allowable image quality level is a numerical value or a code indicating an extent of allowable or non-allowable image quality of an input MR image. The allowable image quality includes, for example, as shown in FIG. 18, two values, namely a value indicating allowable image quality of an input MR image (hereinafter "allowable code") and a value indicating not-allowable image quality (hereinafter "non-allowable code").

The neural network may be learned through supervised learning for example, based on a large number of learning samples. The learning of the neural network, in other words, generation of a learned model, may be carried out with a computer, such as a model learning apparatus, etc. The model learning apparatus may be a computer incorporated in the MRI apparatus 100, or a separate computer.

For example, in the case of supervised learning, an MR image as an input and an allowable image quality level as a supervisor are included. The allowable image quality is determined in advance by an annotator's observing an MR image as an input and determining allowability of the MR image. The allowable image quality level is not necessarily determined manually, and may be determined through image processing, etc. A criterion on the allowability is determined based on whether or not the image quality would withstand diagnosis. For example, if noise or artifact due to data deficiency, etc. is superimposed on an image, and the image is not suitable for diagnosis, the data quality is determined to be "not allowable". The criterion on the allowability is not necessarily definite. The model learning apparatus performs forward propagation processing by applying a neural network to an MR image as an input, and outputs an allowable image quality level (hereinafter, "estimated allowable image quality level"). Next, the model learning apparatus performs back propagation processing by applying a difference (error) between the estimated allowable image quality level and an allowable image quality level as a supervisor to the neural network, and calculates a gradient vector. Subsequently, the model learning apparatus updates parameters of the neural network, such as a weighted matrix and a bias, etc. based on the gradient vector. A learned model is generated by repeating the forward propagation processing, the back-propagation processing, and the parameter update processing, with changing learning samples.

Next, an operation at the time when a learned model is operated will be briefly explained. The processing circuitry 131 performs image reconstruction on the acquired first MR signals to reconstruct an MR image. For the acquired first MR signals, the MR signals acquired between the time when a first pulse sequence is started and the time when a predetermined period of time elapses since the start are used, for example. In the reconstruction method at this stage, image quality that would withstand diagnosis is not required; accordingly, any method can be adopted as long as it is easy and quick. In the case of radial scanning, a Jackson method or gridding method can be adopted for example.

When an MR image is generated, the processing circuitry 131 applies a learned model to the generated MR image to output an allowable image quality level. If a non-allowable code is output as an allowable image quality level, the processing circuitry 131 determines that allowable acquisition is necessary. In this case, a second pulse sequence is added to the imaging protocol. If an allowable code is output as an allowable image quality level, the processing circuitry 131 determines that allowable acquisition is not necessary.

The added second pulse sequence consists typically of trajectories having the same difference acquisition positions from the first pulse sequence. However, the present embodiment is not limited thereto. In the second pulse sequence, a flip angle, transmission frequencies of various RF pulse, and an echo order may be changed from those of the first pulse sequence.

For example, if the first pulse sequence and the second pulse sequence are a fast spin echo (FSE) method, trajectories that have the same acquisition positions as those of the first pulse sequence and have a different echo order are added as the second pulse sequence. As the echo order, a sequential order or a centric order, or any other appropriate order can be adopted. It is thereby possible to reduce image quality-degrading factors originating from echo-order dependency.

For example, if the first pulse sequence and the second pulse sequence are a multi-segment echo planar imaging (EPI) method, trajectories having different segment positions in k-space are added in a unit of segment as a second pulse sequence. For example, if data acquisition is performed in accordance with the first pulse sequence based on trajectories of even-number phase encoding, trajectories of odd-number phase encoding may be added as the second pulse sequence. If data acquisition is performed in accordance with the first pulse sequence based on the order of even-number and odd-number phase encoding, trajectories of a phase encoding of a central portion may be added as the second pulse sequence. It is thereby possible to reduce image quality-degrading factors originating from segment position dependency.

For example, if the first pulse sequence and the second pulse sequence include a fat suppression pulse, a fat suppression pulse having a transmission frequency and a flip angle differing from those of the first pulse sequence may be added as the second pulse sequence. This technique can be applied to not only a fat suppression pulse but also to a pulse for suppressing a discretionary component, such as a water suppression pulse. It is thus possible to improve suppression effects of the second pulse sequence in comparison to the first pulse sequence.

The above-described change of a transmission frequency and a flip angle is not limited to the case of a suppression pulse, and may be applied to any appropriate RF pulse, such as a 90-degree pulse or a 180-degree pulse.

The allowable image quality level of the output of the learned model is not limited to the above-described two-class classification, and multiple-class classification may be adopted. If multiple-class classification is adopted, a sequential value or discrete value indicating an allowable image quality level is output.

The learned model may be learned so as to output whether or not additional acquisition is necessary, not an allowable image quality level. Non-allowance of image quality corresponds to requiring additional acquisition, and allowance of image quality corresponds to not requiring additional acquisition. In the case of two-class classification, the learned model may be learned so as to output a code indicating that additional imaging is required, instead of a non-allowance code, and to output a code indicating that additional imaging is not required, instead of an allowance code. In the case of multiple-class classification, a final output layer into which an allowable image quality level is input, and which outputs whether or not additional imaging is necessary, should be provided in an output layer of the learned model.

Whether or not additional acquisition is necessary can be determined without using the learned model, as described in the foregoing embodiment and modifications. In the foregoing embodiment and modifications, the processing circuitry 131 calculates reliability level information for evaluating image quality based on acquired first MR signals, and determines whether or not additional acquisition is necessary based on the reliability level information. The reliability level information is a data amount of the acquired MR signals, a level of difference from a subject model, a detected amount of artifact caused by a body motion of the subject, and a level of difference in pixel values due to a delay of a contrast agent.

An example in which a data amount of acquired MR signals is used as reliability level information is described in the first embodiment and the first modification, etc. In this case, as shown in step Sa1 of FIG. 3, for example, whether or not additional acquisition is necessary is determined by comparing a data amount and a reference value.

Next, a case where the reliability level information is a level of difference from a subject model will be described. A subject model is a preliminary knowledge of an anatomical structure of the subject obtained through analysis of MR images of a variety of subjects. The anatomical structure of the subject drawn on the MR image has a shape more complicated than that of a subject model.

The processing circuitry 131 calculates a level of difference to a subject model of the MR image generated based on an MR image based on acquired MR signals and a subject model. A level of difference is calculated for whole MR image. Next, the processing circuitry 131 compares a level of difference with a predetermined reference value. If a level of difference is greater than a reference value, the processing circuitry 131 determines that there is noise or artifact in an MR image due to data deficiency. Even in a case where a data amount still lacks even after data acquisition is performed to all the trajectories, the processing circuitry 131 can accurately determine that there is noise or artifact. In this case, the processing circuitry 131 determines that additional acquisition is necessary. If a level of difference is smaller than a reference value, the processing circuitry 131 determines that there is no noise or artifact in an MR image due to data deficiency. In this case, the processing circuitry 131 determines that additional acquisition is not necessary.

The subject model is determined based on a total variation (TV) model, a wavelet model, or a neural network, and the like. The case of a TV model will be described. For example, a total variation is calculated for each of a large number of MR images where no noise or artifact due to data deficiency is present. Statistical values of all the calculated total variations are used as a subject model. As another example, a total variation may be calculated for each of a large number of MR images where noise or artifact due to data deficiency is present, and statistical values of all the calculated total variations may be used as a subject model. The processing circuitry 131 calculates a total variation of an input MR image generated based on the acquired first MR signals, and calculates a difference between the calculated total variation and the statistical values. A level of difference shows a difference in an image structure between the input MR image and the subject model. As described above, the processing circuitry 131 determines whether or not additional acquisition is necessary based on comparison between the difference (level of difference) and the predetermined reference value.

The total variation may be calculated for whole MR image, a local area, or each pixel. A wavelet model can be used in a similar manner.

Next, the case of a neural network will be described. The neural network is a neural network for image recognition into which an MR image is input and is learned so as to output presence/absence of noise or artifact due to data deficiency. Such a neural network is learned based on multiple learning samples using an L1 error or an L2 error, for example. The neural network can be learned through supervised learning, for example. For example, in the case of supervised learning, an MR image is used as input, and presence/absence of noise or artifact due to data deficiency is used as a supervisor.

Next, the case where the reliability level information is a detected amount of artifact resulting from a body motion of a subject will be described. This example corresponds to the fifth modification. By setting reliability level information as a detected amount of artifact, it is possible to compensate for an insufficient amount of data due to data corruption resulting from conscious, unconscious or a physiologic body move by a subject.

Next, the case where the reliability level information is a level of difference in pixel values due to a delay of a contrast agent will be described. Due to a delay of a contrast agent, a situation in which the contrast agent has not yet arrived, an ROI in whole or a part of a contrast imaging period continues. Accordingly, a desired MR image in such that contrast tissue is drawn therein cannot be obtained due to a delay of a contrast agent. A delay of a contrast agent can be evaluated based on a difference between pixel values of pixels when a contrast agent has arrived and pixel values of pixels when a contrast agent has not yet arrived. For example, pixel values of pixels when a contrast agent has arrived are acquired from a plurality of MR images, and statistical values, such as an average of the pixel values and a median (hereinafter, "contrast reference value") are pre-stored. The contrast reference value may be stored for each type of tissue, such as heart and kidney, or each type of contrast enhancement schemes, such as T1 enhancement and T2 enhancement, etc.

The processing circuitry 131 generates an MR image based on acquired MR signals, and calculates a difference between pixel values of pixels belonging to contrast-target tissue in the generated MR image and the contrast reference value corresponding to the contrast target tissue. The difference corresponds to reliability level information; in other words, a level of difference in pixel values due to a delay of a contrast agent. The contrast target tissue may be specified by performing image recognition processing on an MR image at an operator's discretion, or may be designated by an operator via the interface 125.

Next, the processing circuitry 131 compares a level of difference with a predetermined reference value. If the level of difference is greater than the reference value, the processing circuitry 131 determines that the contrast agent has not yet arrived. In this case, the processing circuitry 131 determines that additional acquisition is necessary. Additional acquisition is performed after a contrast agent is injected into the subject once again. If the level of difference is smaller than the reference value, the processing circuitry 131 determines that the contrast agent has arrived. In this case, the processing circuitry 131 determines that additional acquisition is not necessary.

According to at least one of the forgoing examples, additional imaging may be performed through adaptively estimating a data amount of MR signals necessary for reconstructing an MR image in accordance with a target for imaging.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
   imaging control circuitry and processing circuitry,
   the imaging control circuitry configured to acquire MR signals in accordance with a first pulse sequence set in an imaging protocol,
   the processing circuitry configured to determine, during acquisition according to the first pulse sequence, whether or not additional acquisition of MR signals is necessary in accordance with a determination of image quality based on the acquired MR signals, and to add a second pulse sequence for the additional acquisition to the imaging protocol if it is determined that the additional acquisition is necessary,
   the imaging control circuitry configured to acquire MR signals in accordance with the added second pulse sequence, and
   the processing circuitry configured to reconstruct an MR image based on the MR signals acquired according to the first pulse sequence and the second pulse sequence,
   wherein the processing circuitry is configured to determine whether or not the additional acquisition is necessary after a predetermined period of time is elapsed since a start time of the acquisition according to the first pulse sequence.

2. A magnetic resonance imaging apparatus according to claim 1, wherein comprising:
   imaging control circuitry and processing circuitry,
   the imaging control circuitry configured to acquire MR signals in accordance with a first pulse sequence set in an imaging protocol,
   the processing circuitry configured to determine, during acquisition according to the first pulse sequence, whether or not additional acquisition of MR signals is necessary in accordance with a determination of image quality based on the acquired MR signals, and to add a second pulse sequence for the additional acquisition to the imaging protocol if it is determined that the additional acquisition is necessary,
   the imaging control circuitry configured to acquire MR signals in accordance with the added second pulse sequence, and
   the processing circuitry configured to:
      reconstruct an MR image based on the MR signals acquired according to the first pulse sequence and the second pulse sequence,
      obtain a body motion state of a subject during the acquisition of MR signals according to the first pulse sequence, and
      determine whether or not the additional acquisition is necessary based on the body motion state and a data amount of the acquired MR signals after a predetermined period of time is elapsed since a start time of the acquisition performed in accordance with the first pulse sequence.

3. The magnetic resonance imaging apparatus according to claim 2, wherein
   the processing circuitry is configured to:
   distinguish the MR signals acquired according to the first pulse sequence into multiple classes corresponding to the body motion state;
   specify a data amount of the MR signals acquired according to the first pulse sequence for each of the multiple classes;
   specify a maximum class in which a data amount is largest among the multiple classes;
   determine that the additional acquisition is necessary if the data amount of the maximum class is smaller than a reference value;
   add, as the second pulse sequence, trajectories different from the MR signals acquired according to the first pulse sequence belonging to the maximum class; and
   reconstruct the MR image based on the MR signals acquired according to the first pulse sequence and second pulse sequence belonging to the maximum class.

4. The magnetic resonance imaging apparatus according to claim 2, wherein
   the processing circuitry is configured to:
   distinguish the MR signals acquired according to the first pulse sequence into multiple classes corresponding to the body motion state;

specify a data amount of the MR signals acquired according to the first pulse sequence for each of the multiple classes;
determine that the additional acquisition is necessary if the data amount of at least one of the multiple classes is smaller than a reference value;
add, as the second pulse sequence, trajectories different from the MR signals acquired according to the first pulse sequence belonging to the at least one class; and
reconstruct the MR image corresponding to each of the multiple classes based on the MR signals acquired according to the first pulse sequence and second pulse sequence classified into the multiple classes.

5. The magnetic resonance imaging apparatus according to claim 2, wherein
the processing circuitry is configured to:
reconstruct an MR image for the body motion state based on the MR signals acquired according to the first pulse sequence for the body motion state; and
determine whether or not the additional acquisition is necessary based on noise intensity in the MR image of the body motion state.

6. The magnetic resonance imaging apparatus according to claim 2, wherein
the processing circuitry is configured to:
reconstruct an MR image for the body motion state based on the MR signals acquired according to the first pulse sequence for the body motion state; and
determine whether or not the additional acquisition is necessary based on an amount of artifact detected in the MR image for the body motion state.

7. The magnetic resonance imaging apparatus according to claim 2, wherein
the processing circuitry is configured to obtain a respiration level of the subject as the body motion state.

8. The magnetic resonance imaging apparatus according to claim 2, wherein
the processing circuitry is configured to obtain the body motion state based on registration between first non-reconstructed image data based on MR signals acquired within a reference period shorter than a total period of the first pulse sequence, and second non-reconstructed image data based on MR signals acquired within each of a plurality of partial periods shorter than the reference period, the second non-reconstructed image data corresponding to each of the plurality of partial periods.

9. The magnetic resonance imaging apparatus according to claim 2, wherein
the processing circuitry is configured to:
reconstruct a reference image based on the MR signals acquired within the reference period shorter than a period of the first pulse sequence;
reconstruct partial images respectively corresponding to a plurality of partial periods shorter than the reference period, based on the MR signals acquired in each of the partial periods; and
obtain the body motion state based on registration between the reference image and the partial images.

10. A magnetic resonance imaging apparatus comprising:
imaging control circuitry and processing circuitry,
the imaging control circuitry configured to acquire MR signals in accordance with a first pulse sequence set in an imaging protocol,
the processing circuitry configured to determine, during acquisition according to the first pulse sequence, whether or not additional acquisition of MR signals is necessary in accordance with a determination of image quality based on the acquired MR signals, and to add a second pulse sequence for the additional acquisition to the imaging protocol if it is determined that the additional acquisition is necessary,
the imaging control circuitry configured to acquire MR signals in accordance with the added second pulse sequence, and
the processing circuitry configured to reconstruct an MR image based on the MR signals acquired according to the first pulse sequence and the second pulse sequence, wherein
the first pulse sequence and the second pulse sequence include, as a parameter, trajectories indicating acquisition positions of MR signals in k-space, and
wherein the processing circuitry is configured to set, before the beginning of the acquisition according to the first pulse sequence, trajectories of the second pulse sequence in such a manner as not to overlap the trajectories of the first pulse sequence.

11. A magnetic resonance imaging apparatus comprising:
imaging control circuitry and processing circuitry,
the imaging control circuitry configured to acquire MR signals in accordance with a first pulse sequence set in an imaging protocol,
the processing circuitry configured to determine, during acquisition according to the first pulse sequence, whether or not additional acquisition of MR signals is necessary in accordance with a determination of image quality based on the acquired MR signals, and to add a second pulse sequence for the additional acquisition to the imaging protocol if it is determined that the additional acquisition is necessary,
the imaging control circuitry configured to acquire MR signals in accordance with the added second pulse sequence, and
the processing circuitry configured to reconstruct an MR image based on the MR signals acquired according to the first pulse sequence and the second pulse sequence, wherein
the processing circuitry is configured to calculate an upper limit of a sum of a data amount of MR signals acquired according to the first pulse sequence and a data amount of MR signals acquired according to the second pulse sequence, based on a specific absorption rate determined before the beginning of the acquisition according to the first pulse sequence,
the imaging control circuitry is configured to stop the acquisition according to the second pulse sequence when the sum reaches the upper limit,
the processing circuitry is configured to reconstruct the MR image based on the MR signals acquired according to the first pulse sequence and the MR signals acquired according to the second pulse sequence before the stopping of the acquisition according to the second pulse sequence.

12. A magnetic resonance imaging apparatus comprising:
imaging control circuitry and processing circuitry, wherein
the imaging control circuitry is configured to acquire MR signals in accordance with a first pulse sequence set in an imaging protocol,
the processing circuitry is configured to determine, during acquisition according to the first pulse sequence, whether or not additional acquisition of MR signals is necessary in accordance with a determination of image quality based on the acquired MR signals, and to add a second pulse sequence for the additional acquisition to the imaging protocol if it is determined that the additional acquisition is necessary, the imaging control circuitry is configured to acquire MR signals in accordance with the added second pulse sequence, and the processing circuitry is configured to reconstruct an MR image based on the MR signals acquired according to the first pulse sequence and the second pulse sequence; and a display which displays, if it is determined that the additional acquisition is necessary, at least one of:

execution of the additional acquisition; an imaging time increased as a result of executing the additional acquisition; and an expected finish time of imaging including the additional acquisition.

13. A magnetic resonance imaging apparatus comprising:

imaging control circuitry and processing circuitry, the imaging control circuitry configured to acquire MR signals in accordance with a first pulse sequence set in an imaging protocol, the processing circuitry configured to determine, during acquisition according to the first pulse sequence, whether or not additional acquisition of MR signals is necessary in accordance with a determination of image quality based on the acquired MR signals, and to add a second pulse sequence for the additional acquisition to the imaging protocol if it is determined that the additional acquisition is necessary, the imaging control circuitry configured to acquire MR signals in accordance with the added second pulse sequence, and the processing circuitry configured to reconstruct an MR image based on the MR signals acquired according to the first pulse sequence and the second pulse sequence;

the imaging control circuitry configured to perform acquisition according to the second pulse sequence subsequently to the acquisition according to the first pulse sequence; and the processing circuitry configured to determine whether or not the additional acquisition is necessary after a predetermined period of time is elapsed since a start time of the acquisition according to the first pulse sequence, and before a time determined by subtracting a time required for determining whether or not the additional acquisition is necessary and adding trajectories of the second pulse sequence from an expected finish time of the acquisition according to the first pulse sequence.

14. A magnetic resonance imaging apparatus comprising:

imaging control circuitry and processing circuitry, wherein the imaging control circuitry is configured to acquire MR signals in accordance with a first pulse sequence set in an imaging protocol, the processing circuitry is configured to determine, during acquisition according to the first pulse sequence, whether or not additional acquisition of MR signals is necessary in accordance with a determination of image quality based on the acquired MR signals, and to add a second pulse sequence for the additional acquisition to the imaging protocol if it is determined that the additional acquisition is necessary, the imaging control circuitry is configured to acquire MR signals in accordance with the added second pulse sequence, and the processing circuitry is configured to reconstruct an MR image based on the MR signals acquired according to the first pulse sequence and the second pulse sequence; and an interface through which an imaging total time is input, wherein the processing circuitry is configured to determine the second pulse sequence based on the first pulse sequence of the imaging total time.

15. A magnetic resonance imaging apparatus comprising:

imaging control circuitry and processing circuitry, wherein the imaging control circuitry is configured to acquire MR signals in accordance with a first pulse sequence set in an imaging protocol, the processing circuitry is configured to determine, during acquisition according to the first pulse sequence, whether or not additional acquisition of MR signals is necessary in accordance with a determination of image quality based on the acquired MR signals, and to add a second pulse sequence for the additional acquisition to the imaging protocol if it is determined that the additional acquisition is necessary, the imaging control circuitry is configured to acquire MR signals in accordance with the added second pulse sequence, and the processing circuitry is configured to reconstruct an MR image based on the MR signals acquired according to the first pulse sequence and the second pulse sequence; and an interface configured to input an instruction to stop acquisition according to the second pulse sequence, wherein the imaging control circuitry is configured to stop the acquisition according to the second pulse sequence upon an input of the instruction to stop, and the processing circuitry is configured to reconstruct the MR image based on the MR signals acquired according to the first pulse sequence and the MR signals acquired according to the second pulse sequence until the instruction to stop is input.

16. A magnetic resonance imaging apparatus comprising:

imaging control circuitry and processing circuitry, the imaging control circuitry configured to acquire MR signals in accordance with a first pulse sequence set in an imaging protocol, the processing circuitry configured to determine, during acquisition according to the first pulse sequence, whether or not additional acquisition of MR signals is necessary in accordance with a determination of image quality based on the acquired MR signals, and to add a second pulse sequence for the additional acquisition to the imaging protocol if it is determined that the additional acquisition is necessary, the imaging control circuitry configured to acquire MR signals in accordance with the added second pulse sequence, the processing circuitry configured to reconstruct an MR image based on the MR signals acquired according to the first pulse sequence and the second pulse sequence, and the processing circuitry configured to reconstruct the MR image with the use of parallel imaging, compression sensing, or a learned neural network.

17. A magnetic resonance imaging apparatus comprising:

imaging control circuitry and processing circuitry, the imaging control circuitry configured to acquire MR signals in accordance with a first pulse sequence set in an imaging protocol, the processing circuitry configured to determine, during acquisition according to the first pulse sequence, whether or not additional acquisition of MR signals is necessary in accordance with a determination of image quality based on the acquired MR signals, and to add a second pulse sequence for the additional acquisition to the imaging protocol if it is determined that the additional acquisition is necessary, the imaging control circuitry configured to acquire MR signals in accordance with the added second pulse sequence, and the processing circuitry configured to:
reconstruct an MR image based on the MR signals acquired according to the first pulse sequence and the second pulse sequence,
calculate reliability level information to evaluate the image quality based on the acquired MR signals, and
determine whether or not the additional acquisition is necessary based on the reliability level information.

18. The magnetic resonance imaging apparatus according to claim 17, wherein
the reliability level information is a data amount of the acquired MR signals, a level of difference from a subject model, an amount of detected artifact resulting from a body motion of a subject, and a level of difference in pixel values due to a delay of a contrast agent.

19. A magnetic resonance imaging apparatus comprising:
imaging control circuitry and processing circuitry,
the imaging control circuitry configured to acquire MR signals in accordance with a first pulse sequence set in an imaging protocol, the processing circuitry configured to determine, during acquisition according to the first pulse sequence, whether or not additional acquisition of MR signals is necessary in accordance with a determination of image quality based on the acquired MR signals, and to add a second pulse sequence for the additional acquisition to the imaging protocol if it is determined that the additional acquisition is necessary, the imaging control circuitry configured to acquire MR signals in accordance with the added second pulse sequence, and the processing circuitry configured to
reconstruct an MR image based on the MR signals acquired according to the first pulse sequence and the second pulse sequence, and
determine whether or not additional acquisition is necessary based on a learned model into which an MR image is input and from which a level of allowable image quality of the MR image is output, and an MR image based on the acquired MR signals.

* * * * *